(12) United States Patent
Li et al.

(10) Patent No.: US 10,615,113 B2
(45) Date of Patent: Apr. 7, 2020

(54) ROTATED METAL-OXIDE-METAL (RTMOM) CAPACITOR

(71) Applicant: QUALCOMM Incorporated, San Diego, CA (US)

(72) Inventors: Xia Li, San Diego, CA (US); Junjing Bao, San Diego, CA (US); Bin Yang, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 44 days.

(21) Appl. No.: 16/007,921

(22) Filed: Jun. 13, 2018

(65) Prior Publication Data

US 2019/0385947 A1    Dec. 19, 2019

(51) Int. Cl.

| | | |
|---|---|---|
| *H01L 23/52* | (2006.01) | |
| *H01L 23/522* | (2006.01) | |
| *H01L 49/02* | (2006.01) | |
| *H01L 23/66* | (2006.01) | |
| *H01L 23/528* | (2006.01) | |
| *H03H 7/38* | (2006.01) | |

(52) U.S. Cl.
CPC ........ *H01L 23/5223* (2013.01); *H01L 23/528* (2013.01); *H01L 23/5226* (2013.01); *H01L 23/66* (2013.01); *H01L 28/86* (2013.01); *H01L 2223/6661* (2013.01); *H03H 7/38* (2013.01)

(58) Field of Classification Search
CPC ... H01L 23/52; H01L 23/522; H01L 23/5223; H01L 23/5226; H01L 23/528; H01L 23/66; H01L 28/86

USPC .......................................................... 257/532
See application file for complete search history.

(56) References Cited

U.S. PATENT DOCUMENTS

| | | | |
|---|---|---|---|
| 6,690,570 | B2 | 2/2004 | Hajimiri et al. |
| 7,994,609 | B2 | 8/2011 | Quinn |
| 8,014,124 | B2 | 9/2011 | Lin |
| 2012/0119326 | A1 | 5/2012 | Sugisaki et al. |
| 2017/0352719 | A1 | 12/2017 | Tsai et al. |
| 2019/0305077 | A1* | 10/2019 | Feng .................. H01L 23/5226 |

* cited by examiner

*Primary Examiner* — Monica D Harrison
(74) *Attorney, Agent, or Firm* — Qualcomm Incorporated/Seyfarth Shaw LLP

(57) ABSTRACT

A capacitor includes a first set of conductive fingers having a first conductive pitch at a first interconnect layer and arranged in a first unidirectional routing. The capacitor further includes a second set of conductive fingers having a second conductive pitch at a second interconnect layer and arranged in a second unidirectional routing that is orthogonal to the first unidirectional routing. The first conductive pitch is different from the second conductive pitch. A first set of through finger vias electrically couples the first set of conductive fingers of the first interconnect layer to the second set of conductive fingers of the second interconnect layer. A third set of conductive fingers at a third conductive layer are parallel to, but offset from, the first set of conductive fingers. A second set of through finger vias electrically couples the third set of conductive fingers to the second set of conductive fingers.

20 Claims, 18 Drawing Sheets

ROTATED METAL-OXIDE-METAL (RTMOM) CAPACITOR

BACKGROUND

Field

Aspects of the present disclosure relate to semiconductor devices and, more particularly, to capacitors in semiconductor structures.

Background

In advanced complementary metal-oxide-semiconductor (CMOS) technologies, a rotated metal-oxide-metal (RTMOM) capacitor is desired for providing a high capacitance value within a small device footprint. Unfortunately, conventional RTMOM structures have low capacitance and occupy a large footprint. Additionally, conventional RTMOM structures are not unidirectional, because they have a common base terminal for each layer. Therefore, there is a desire for an RTMOM capacitor that overcomes these deficiencies.

SUMMARY

A capacitor includes a first set of conductive fingers having a first conductive pitch at a first interconnect layer and arranged in a first unidirectional routing. The capacitor further includes a second set of conductive fingers having a second conductive pitch at a second interconnect layer and arranged in a second unidirectional routing that is orthogonal to the first unidirectional routing. The first conductive pitch is different from the second conductive pitch. A first set of through finger vias electrically couples the first set of conductive fingers of the first interconnect layer to the second set of conductive fingers of the second interconnect layer. A third set of conductive fingers at a third conductive layer are parallel to, but offset from, the first set of conductive fingers. A second set of through finger vias electrically couples the third set of conductive fingers to the second set of conductive fingers.

A method of fabricating a capacitor includes fabricating a first set of conductive fingers having a first conductive pitch at a first interconnect layer in a first unidirectional routing. The method further includes fabricating a second set of conductive fingers having a second conductive pitch at a second interconnect layer in a second unidirectional routing that is orthogonal to the first unidirectional routing. The first conductive pitch is different from the second conductive pitch. The method further includes fabricating a third set of conductive fingers at a third interconnect level. The third set of conductive fingers are parallel to, but offset from, the first set of conductive fingers. The method further includes electrically coupling the first set of conductive fingers of the first interconnect layer to the second set of conductive fingers of the second interconnect layer with a first set of finger vias. The method further includes electrically coupling the third set of conductive fingers to the second set of conductive fingers with a second set of finger vias.

A capacitor includes a first set of conductive fingers having a first conductive pitch at a first interconnect layer and arranged in a first unidirectional routing. The capacitor further includes a second set of conductive fingers having a second conductive pitch at a second interconnect layer and arranged in a second unidirectional routing that is orthogonal to the first unidirectional routing. The first conductive pitch is different from the second conductive pitch. A third set of conductive fingers at a third conductive layer are parallel to, but offset from, the first set of conductive fingers. The capacitor further includes means for electrically coupling the first set of conductive fingers of the first interconnect layer to the second set of conductive fingers of the second interconnect layer. The capacitor further includes means for electrically coupling the third set of conductive fingers to the second set of conductive finger vias.

Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
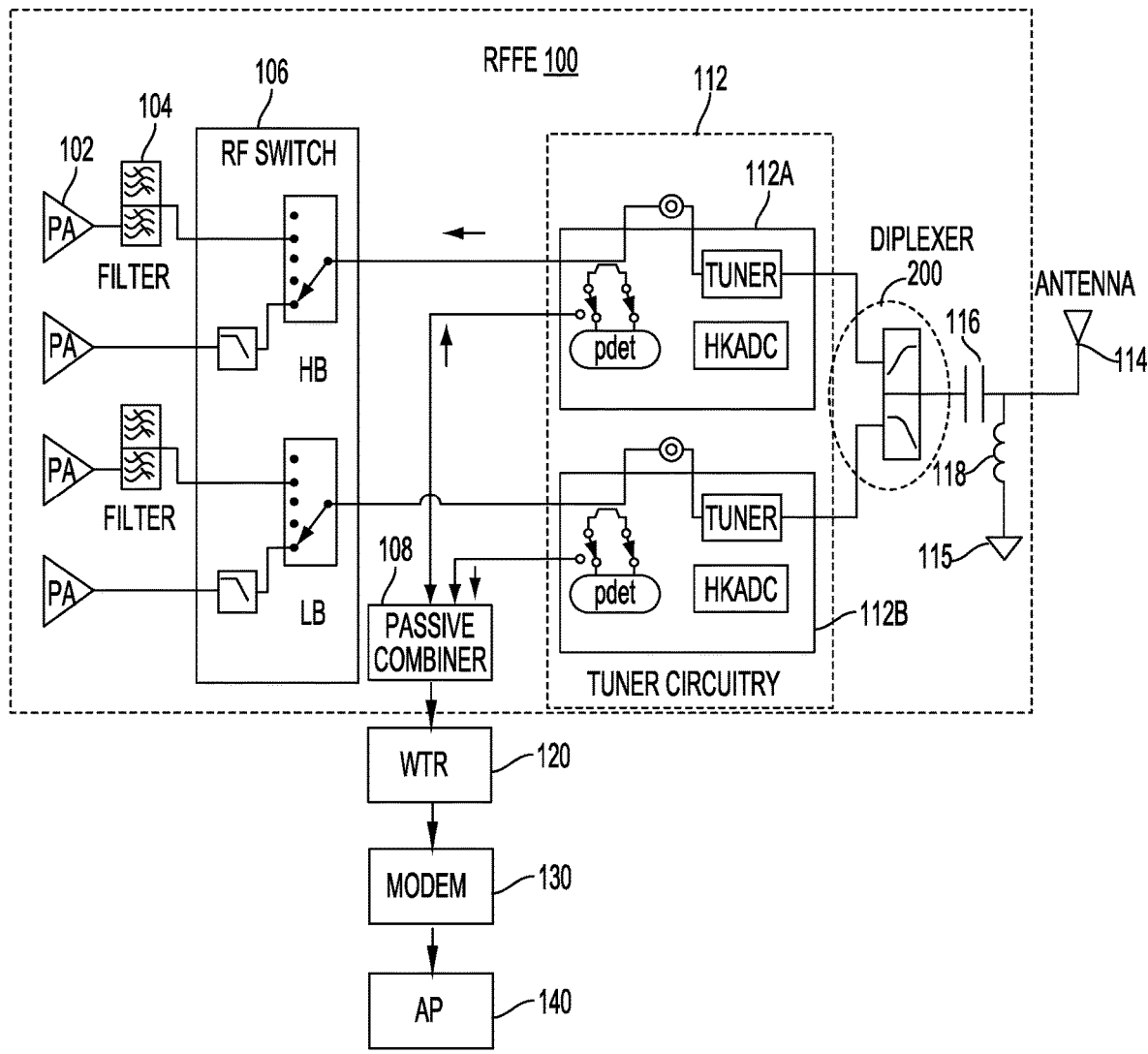
FIG. 1 is a schematic diagram of a radio frequency (RF) front end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile communications devices have become common. The prevalence of these mobile devices is driven in part by the many functions that are now enabled on such devices. Demand for such functions increases processing capability specifications and creates a desire for more powerful batteries. Within the limited space inside the housing of a mobile communications device, batteries compete with the processing circuitry. These and other factors contribute to a continued miniaturization of components within the mobile communications device.

Miniaturization of the components impacts all aspects of the processing circuitry including the transistors and passive elements of the processing circuitry, such as capacitors. One miniaturization technique involves moving some passive elements from the printed circuit board into the integrated circuitry. One technique for moving passive elements into the integrated circuitry involves creating metal-oxide-metal (MOM) capacitors during back-end-of-line (BEOL) integrated circuit fabrication. Each integrated circuit complies with a collection of process parameters for allowing manufacturing of circuits for operating under desired specifications (sometimes called a "process window"). The process window may be unique to a particular integrated circuit or may be duplicated across a product line or have other applications as desired. Nevertheless, the existence of a corresponding process window effectively sets forth the thresholds with which an integrated circuit complies to be suitable for functioning as designed (e.g., an integrated circuit in a mobile communications device).

Many current back-end-of-line MOM capacitors have a two element interdigitated structure. Such capacitors are created using masks and deposition processes. In such processes, a substrate may be provided with a mask. A deposition technique may generate the two conductive elements of the capacitor. In this regard, the two conductive elements form the positive and negative nodes of the capacitor. Because capacitance is a function of the size of the conductive elements, increased capacitance is achieved through larger positive and negative nodes. Nevertheless, larger nodes increase the footprint of the capacitor, defeating the miniaturization goals. In addition, the larger nodes conflict with the process window and increase local stress significantly.

One approach for creating higher capacitance MOM devices is providing a layered interdigitated structure, in which additional layers of interdigitated structures are stacked vertically on top of each other. In this manner, the size of the nodes is effectively increased because each node has conductive elements in multiple planes. These larger nodes create a capacitor having a higher capacitance because each of the layers contributes to the overall capacitance of the device. Furthermore, additional capacitance is created between the layers. In some MOM devices, alternating layers of interdigitated structures are rotated relative to layers above and below one another.

Semiconductor fabrication processes are often divided into three parts: a front-end-of-line (FEOL), a middle-of-line (MOL), and a back-end-of-line (BEOL). Front-end-of-line processes include wafer preparation, isolation, well formation, gate patterning, spacers, and dopant implantation. A middle-of-line process includes gate and terminal contact formation. The gate and terminal contact formation of the middle-of-line process, however, is an increasingly challenging part of the fabrication flow, particularly for lithography patterning. Back-end-of-line processes include forming interconnects and dielectric layers for coupling to the FEOL devices. These interconnects may be fabricated with a dual damascene process using plasma-enhanced chemical vapor deposition (PECVD) deposited interlayer dielectric (ILD) materials.

More recently, the number of interconnect levels for circuitry has substantially increased due to the large number of devices that are now interconnected in a modern microprocessor. The increased number of interconnect levels for supporting the increased number of devices involves more intricate middle-of-line processes to perform the gate and terminal contact formation.

In particular, advances in lithography have reduced line spacing to the nanometer range in integrated circuit chips. The reduced line spacing increases the available area for capacitance because more lines of charge storage can be placed in the same volume of material. Further, back-end-of-line interconnect structures, as described in one aspect of the present disclosure, allow for an improved capacitor structure.

As described, the middle-of-line interconnect layers may refer to the conductive interconnects for connecting a first conductive layer (e.g., metal 1 (M1)) to an oxide diffusion (OD) layer of an integrated circuit as well for connecting M1 to the active devices of the integrated circuit. The middle-of-line interconnect layers for connecting M1 to the OD layer of an integrated circuit may be referred to as "MD1" and "MD2," collectively referred to herein as "MD interconnects." The middle-of-line interconnect layer for connecting M1 to the polysilicon gates of an integrated circuit may be referred to as "MP," or "MP interconnects." Within the present disclosure, the term "M1" is intended to describe any type of conductive material, not just metal, in the closest layer to the devices.

In advanced complementary metal-oxide-semiconductor (CMOS) technologies, a rotated metal-oxide-metal (RT-MOM) capacitor can be used as a de-coupling capacitor, which has a high capacitance value within a small device footprint. Conventional RTMOM structures have low capacitance and occupy a large footprint. Additionally, conventional RTMOM structures are not unidirectional, because they have a common base terminal for each layer. Therefore, there is a desire for an RTMOM capacitor that overcomes these deficiencies.

Aspects of the present disclosure are directed to an orthogonal unidirectional metal-oxide-metal capacitor (e.g., rotated metal-oxide-metal (RTMOM) capacitor) without a common base terminal for each layer. The aspects of the present disclosure reduce a device footprints and increase a capacitance value.

The capacitor may include a first set of conductive fingers having a first conductive pitch at a first interconnect layer and arranged in a first unidirectional routing. A second set of conductive fingers may have a second conductive pitch at a second interconnect layer and may be arranged in a second unidirectional routing that is orthogonal to the first unidirectional routing. The first conductive pitch may be different from the second conductive pitch. A first set of through finger vias electrically couples the first set of conductive fingers of the first interconnect layer to the second set of conductive fingers of the second interconnect layer. A third set of conductive fingers at a third conductive layer is parallel to the first set of conductive fingers, but offset from the first set of conductive fingers. A second set of through finger vias electrically couples the third set of conductive fingers to the second set of conductive finger vias.

FIG. 1 is a schematic diagram of a radio frequency (RF) front end (RFFE) module 100 employing passive devices including a capacitor 116 (such as a rotated metal-oxide-metal (RTMOM) capacitor structure) that could be integrated with an inductor 118. The RF front end module 100 includes power amplifiers 102, duplexer/filters 104, and a radio frequency (RF) switch module 106. The power amplifiers 102 amplify signals to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RF front end module 100.

The radio frequency (RF) front end module 100 also includes tuner circuitry 112 (e.g., first tuner circuitry 112A and second tuner circuitry 112B), the diplexer 200, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130, and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
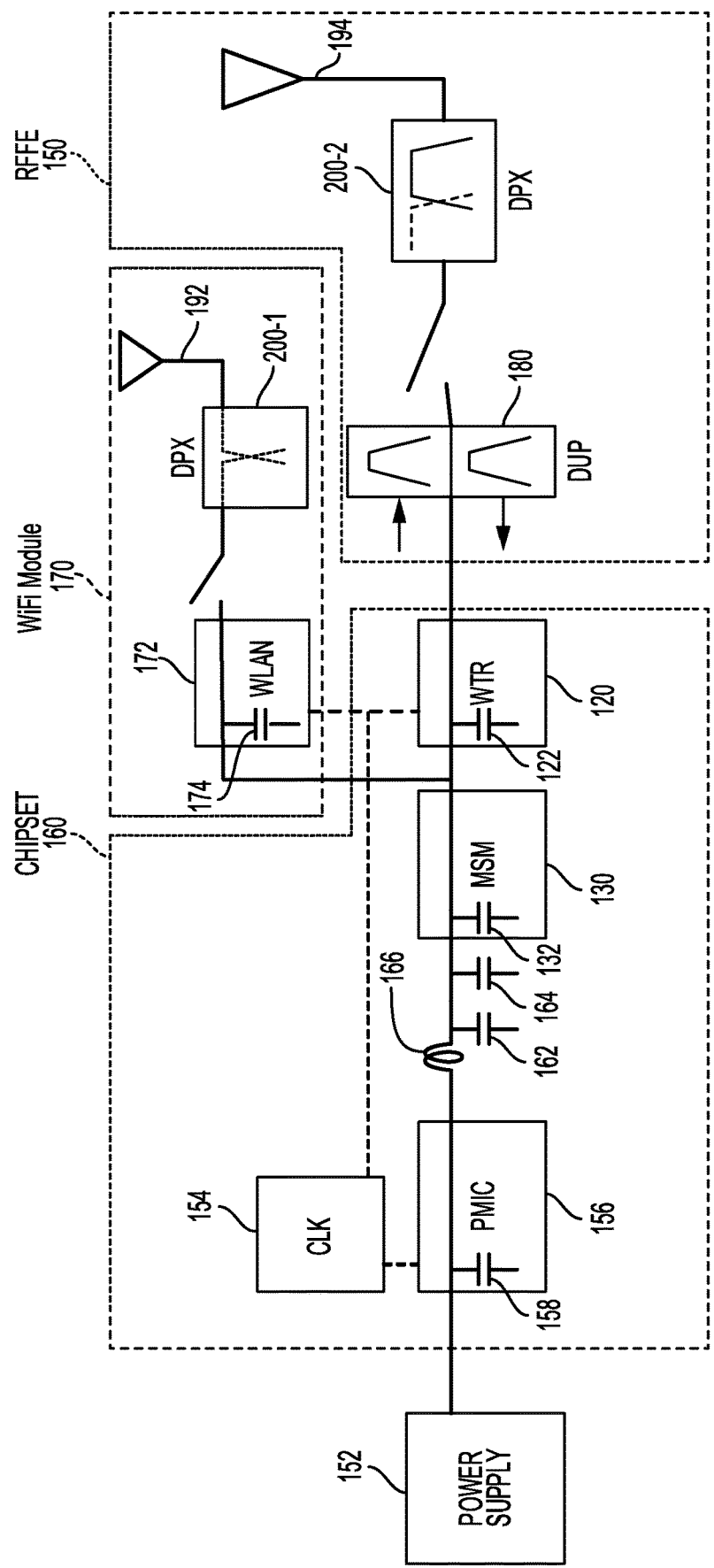
FIG. 2 is a schematic diagram of a radio frequency (RF) front end (RFFE) module employing passive devices for a chipset.

FIG. 2 is a schematic diagram of a wireless local area network (WLAN) (e.g., WiFi) module 170 including a first diplexer 200-1 and an RF front end (RFFE) module 150 including a second diplexer 200-2 for a chipset 160, including a rotated metal-oxide-metal (RTMOM) capacitor structure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity.

The PMIC 156, the modem 130, the wireless transceiver 120, and the WLAN module 172 each include capacitors (e.g., 158, 132, 122, and 174) and operate according to a clock 154. In addition, the inductor 166 couples the modem 130 to the PMIC 156. The geometry and arrangement of the various capacitors and inductor in the chipset 160 may consume substantial chip area.

Figure 3:
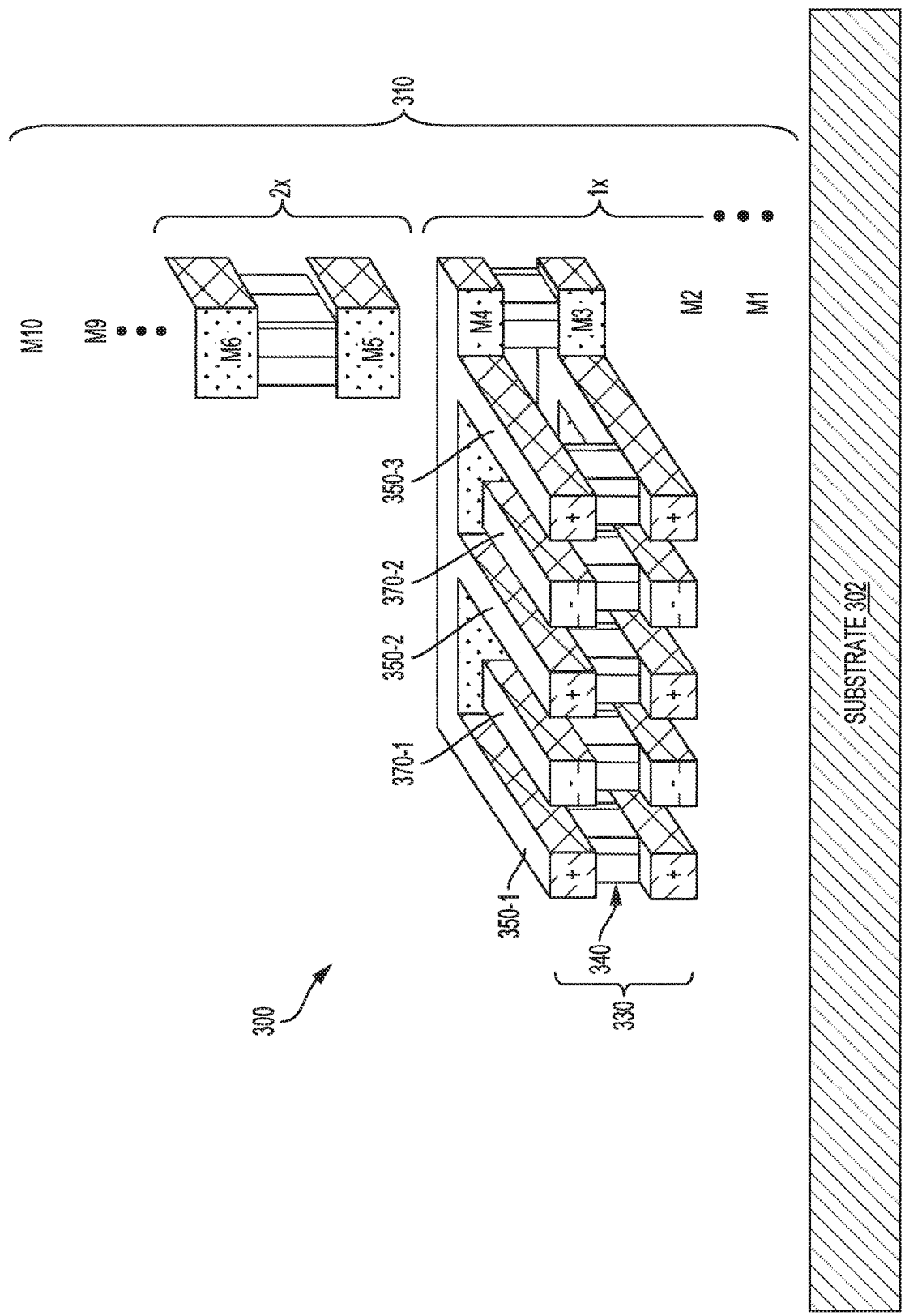
FIG. 3 is a cross section illustrating an integrated circuit (IC) device including an interconnect stack that contains metal-oxide-metal (MOM) capacitor structures.

FIG. 3 is a block diagram illustrating a cross section of an analog integrated circuit (IC) device 300 including an interconnect stack 310, hosting a finger metal-oxide-metal (FMOM) capacitor structure. The interconnect stack 310 of the IC device 300 includes multiple conductive interconnect layers (M1, . . . , M9, M10) on a semiconductor substrate (e.g., a diced silicon wafer) 302. The semiconductor substrate 302 supports a metal-oxide-metal (MOM) capacitor (e.g., MOM capacitor 330) and/or a metal-oxide-semiconductor (MOS) device. In this example, the MOM capacitor 330 is formed in the M3 and M4 interconnect layers, below the M5 and M6 interconnect layers. The MOM capacitor 330 is formed from lateral conductive fingers of different polarities using the conductive interconnect layers (M3 and M4) of the interconnect stack 310. A dielectric (not shown) is between the conductive fingers.

As shown in FIG. 3, the MOM capacitor 330 makes use of a lateral (intra layer) capacitive coupling 340 between fingers (e.g., 350, 370) formed by standard metallization of the conductive interconnects (e.g., wiring lines and vias). Additionally, the fingers 350, 370 each have a common base terminal for each layer. As a result, the MOM capacitor 330 is not unidirectional, and occupies a large footprint.

Conventional metal-oxide-metal (MOM) capacitors are used in radio frequency (RF) or analog devices, which specify a high capacitance value within a small device footprint or more capacitance. Conventional finger metal-oxide-metal (FMOM) capacitor structures do not satisfy circuit design specifications due to alternating layers that are orthogonal to each other, each layer having a unidirectional routing specification. As a result, a common base terminal of each layer specifies a bi-directional routing pattern, which is not allowed in unidirectional routing. Additionally, conventional FMOM or rotated metal-oxide-metal (RTMOM) capacitors have a same metal pitch at all levels, which limits a total capacitance Aspects of the present disclosure provide an orthogonal unidirectional metal-oxide-metal capacitor (e.g., rotated metal-oxide-metal (RTMOM) capacitor) without a common base terminal for each layer. The aspects of the present disclosure reduce a device footprint and increase capacitance values. For example, a first set of conductive fingers is offset from a third set of conductive fingers such that the first set of conductive fingers has a different pitch than the third set of conductive fingers.

Figure 4:
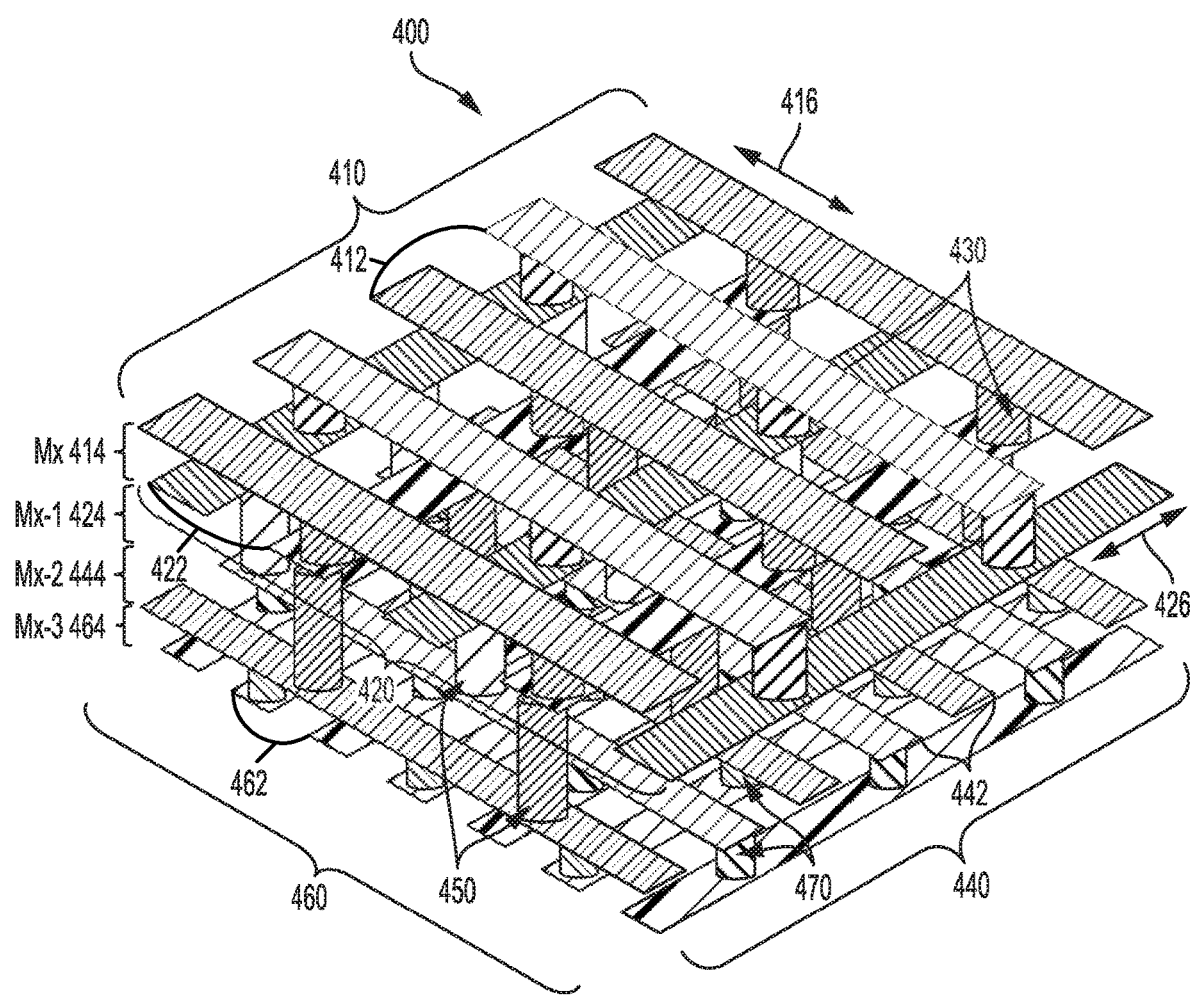
FIG. 4 illustrates a perspective view of a rotated metal-oxide-metal (RTMOM) capacitor structure, according to aspects of the present disclosure.

FIG. 4 illustrates a perspective view of a rotated metal-oxide-metal (RTMOM) 400 (e.g., a capacitor structure), according to aspects of the present disclosure. The RTMOM 400 may also include a metal-insulator-metal (MIM) capacitor. The RTMOM 400 may include a first set of conductive fingers 410 having a first conductive pitch 412 at a first interconnect layer 414 and arranged in a first unidirectional routing 416. For example, the first conductive pitch 412 may be 1.x times (e.g., 150%, if x=5) a pitch of a third set of conductive fingers 440 at a third interconnect layer 444, such as an Mx-2 interconnect layer. According to an aspect of the present disclosure, the Mx interconnect layer may be any of the M6-M8 interconnect layers.

The RTMOM 400 may further include a second set of conductive fingers 420 having a second conductive pitch 422 at a second interconnect layer 424 and arranged in a second unidirectional routing 426. For example, the second conductive pitch 422 may be the same or different from the first conductive pitch 412. According to an aspect of the present disclosure, the second conductive pitch 422 may be 1.x times (e.g., 150%, if x=5) a fourth conductive pitch 462. The second unidirectional routing 426 may be orthogonal to the first unidirectional routing 416. The second interconnect layer 424 may be an Mx-1 interconnect layer. According to an aspect of the present disclosure, the Mx-1 interconnect layer may be any of the M5-M7 interconnect layers.

A first set of vias 430 (e.g., a set of through finger vias) may electrically couple the first set of conductive fingers 410 of the first interconnect layer 414 to the second set of conductive fingers 420 of the second interconnect layer 424. For example, the first set of vias 430 may couple the Mx interconnect layer to the Mx-1 interconnect layer. The first set of vias 430 may be V4-V6 vias.

According to aspects of the present disclosure, a finger via of the first set of vias 430 may couple a conductive finger of the first set of conductive fingers 410 to a conductive finger of the second set of conductive fingers 420.

The RTMOM 400 may include a third set of conductive fingers 440 having a third conductive pitch 442 at a third interconnect layer 444 and arranged in the first unidirectional routing 416. Alternatively, the third set of conductive fingers 440 may be arranged in the second unidirectional routing 426. As seen in FIG. 4, the third set of conductive fingers 440 are offset from the first set of conductive fingers 410. The third conductive pitch 442 may be the same or different from the first conductive pitch 412 and/or the second conductive pitch 422. For example, the first conductive pitch 412 may be equal to or greater than or greater than 1.x times (e.g., 150%, if x=5) the third conductive pitch 442. The third interconnect layer 444 may be an Mx-2 interconnect layer. According to an aspect of the present disclosure, the Mx-2 interconnect layer may be any of the M2-M4 interconnect layers. A second set of vias 450 may electrically couple the second set of conductive fingers 420 to the third set of conductive fingers 440. For example, the second set of vias 450 may be V2-V4 vias.

The RTMOM 400 may include a fourth set of conductive fingers 460 having a fourth conductive pitch 462 at a fourth interconnect layer 464 and arranged in the second unidirectional routing 426. Alternatively, the fourth set of conductive fingers 460 may be arranged in the first unidirectional routing 416. The fourth conductive pitch 462 may be the same or different from the first conductive pitch 412 and/or the second conductive pitch 422. For example, the second conductive pitch 422 may be equal to or greater than 1.x times (e.g., 150%, if x=5) the fourth conductive pitch 462. The fourth interconnect layer 464 may be an Mx-3 interconnect layer. According to an aspect of the present disclosure, the Mx-3 interconnect layer may be any of the M1-M3 interconnect layers. A third set of vias 470 may electrically couple the third set of conductive fingers 440 to the fourth set of conductive fingers 460. For example, the third set of vias 470 may be V1-V2 vias.

Figure 5A:
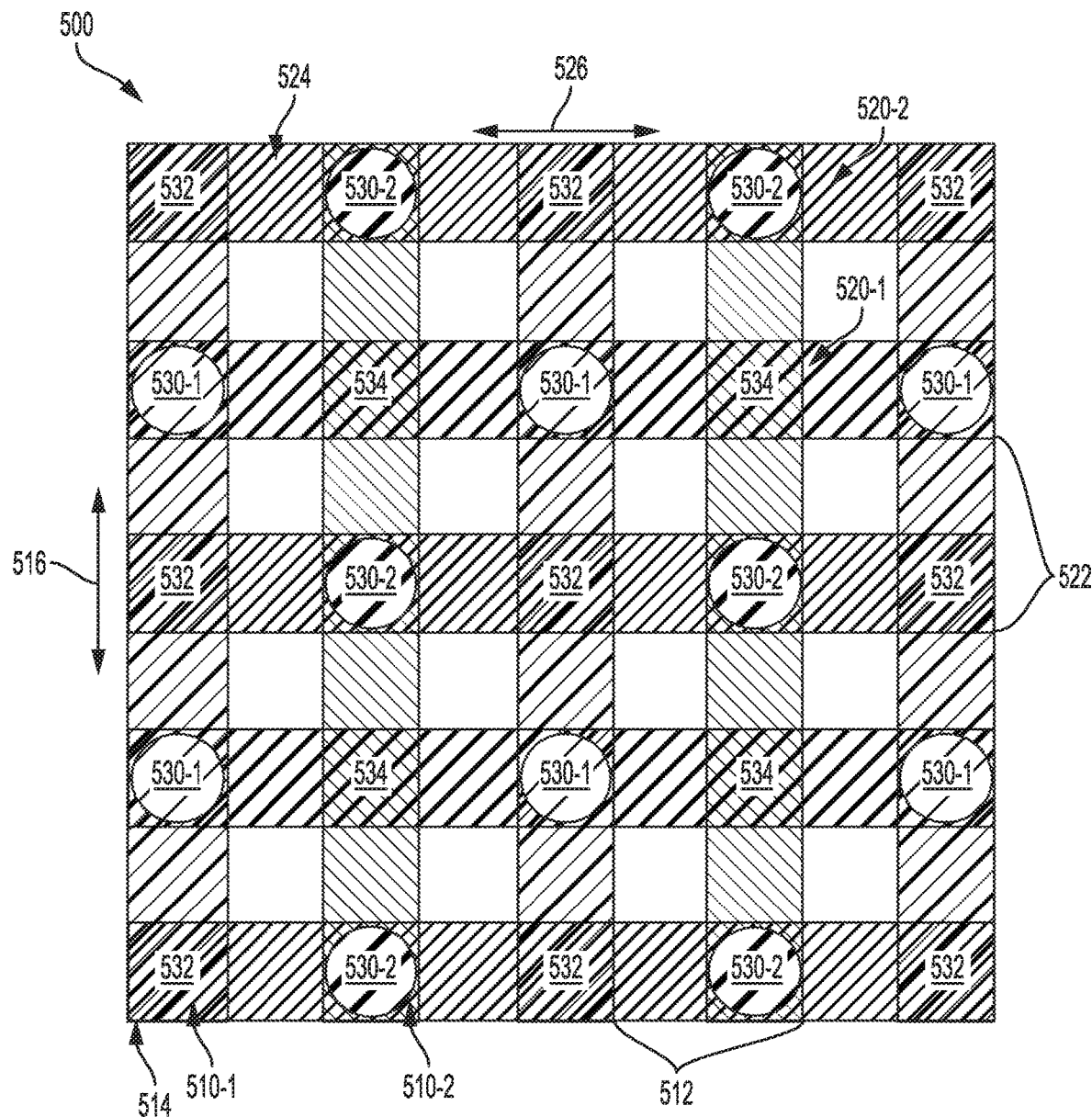
FIGS. 5A-5C illustrate top views of a rotated metal-oxide-metal (RTMOM) capacitor, according to aspects of the present disclosure.
Figure 5B:
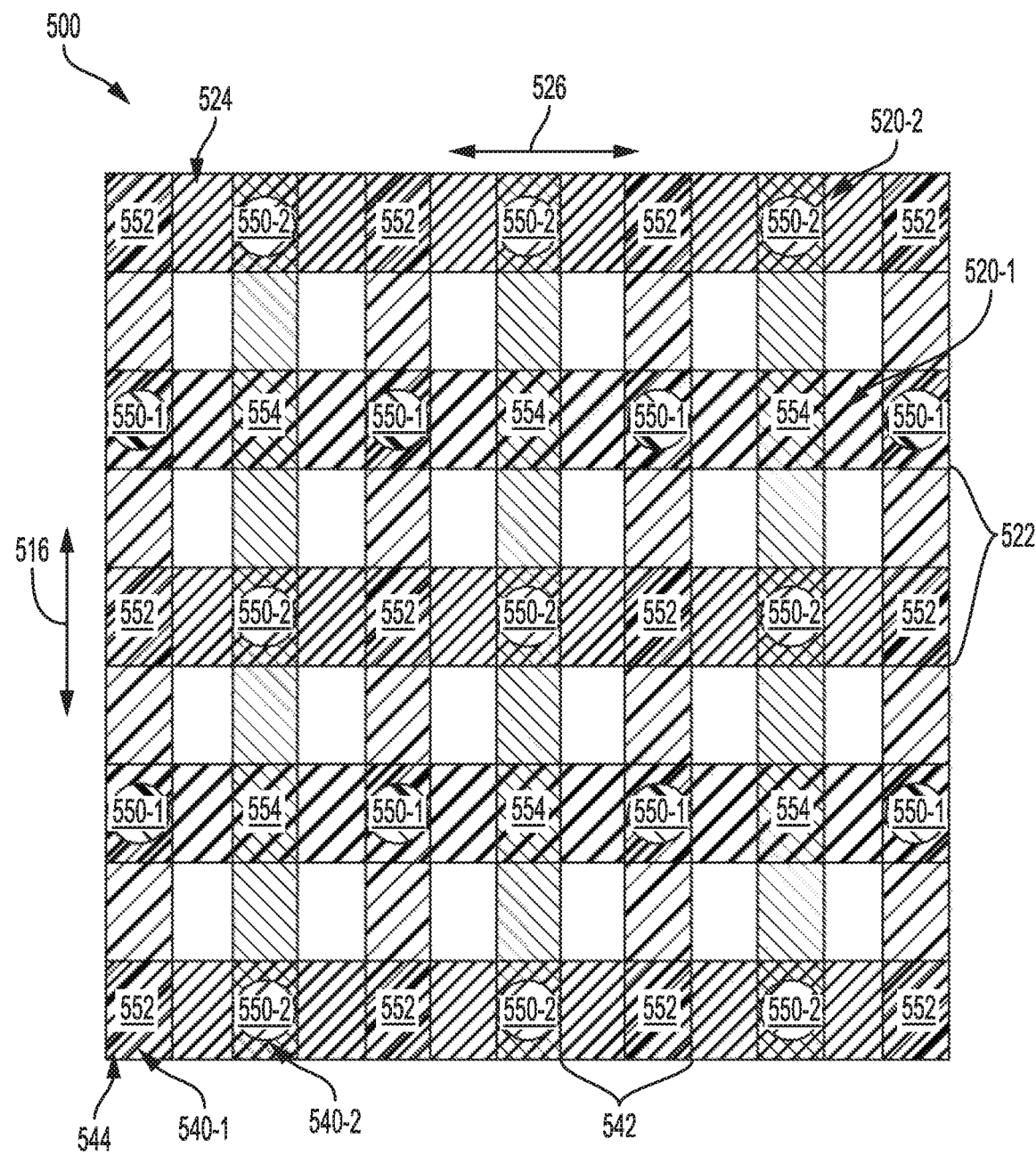
Figure 5C:
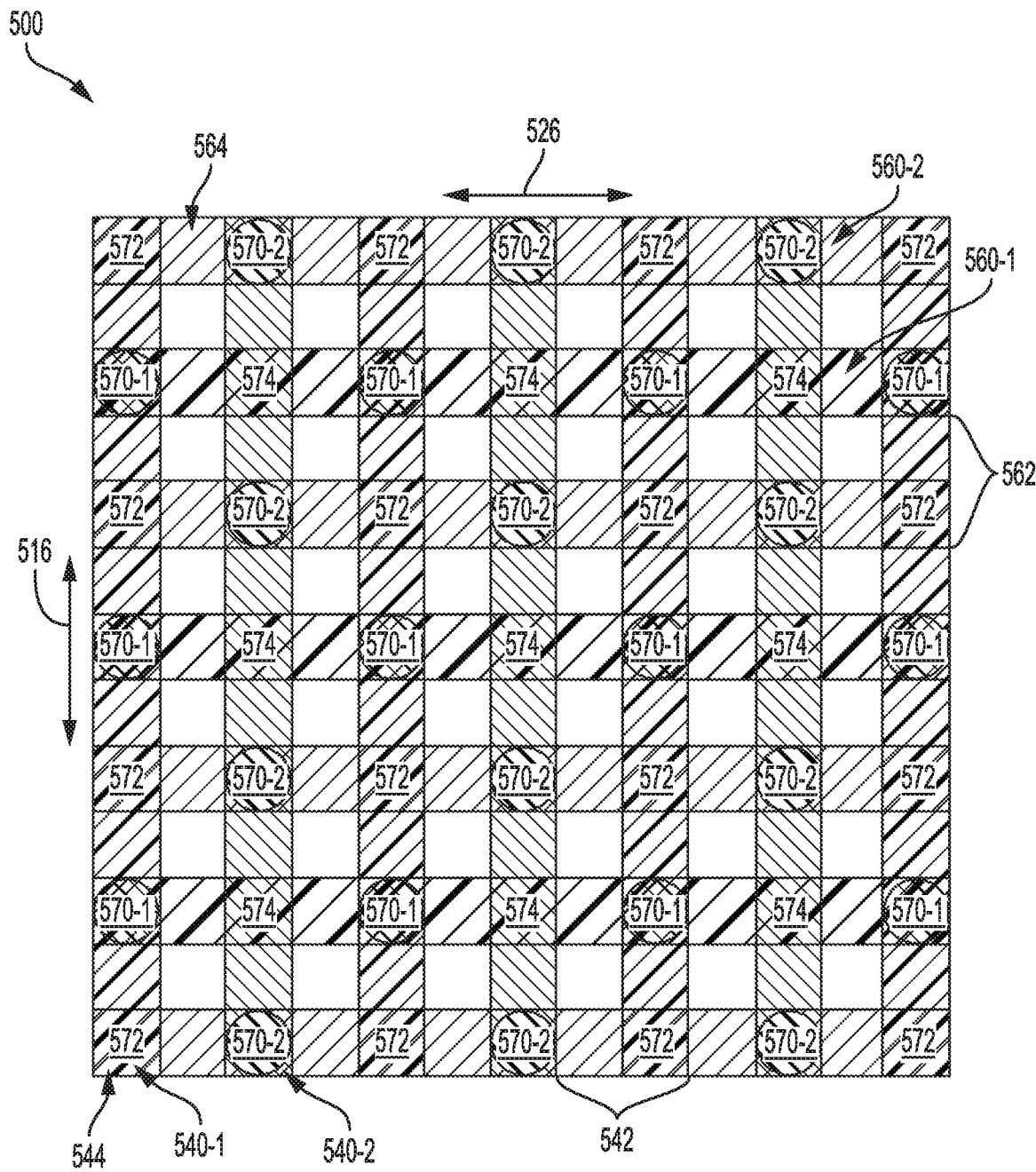

FIGS. 5A-5C illustrate top views of an RTMOM 500 (e.g., a capacitor), according to aspects of the present disclosure. Referring to FIG. 5A, a first set of conductive fingers 510 having a first conductive pitch 512 at a first interconnect layer 514 and arranged in a first unidirectional routing 516 is illustrated. For example, the first conductive pitch 512 may be 200% larger than a width of the first set of conductive fingers 510 and the first interconnect layer 514 may be an Mx interconnect layer. According to an aspect of the present disclosure, the Mx interconnect layer may be any of the M6-M8 interconnect layers.

The RTMOM 500 may further include a second set of conductive fingers 520 having a second conductive pitch 522 at a second interconnect layer 524 and arranged in a second unidirectional routing 526. For example, the second conductive pitch 522 may be the same or different from the first conductive pitch 512. According to an aspect of the present disclosure, the second conductive pitch 522 may be equal to or greater than 200% larger than a width of the second set of conductive fingers 520. The second unidirectional routing 526 may be orthogonal to the first unidirectional routing 516. The second interconnect layer 524 may be an Mx-1 interconnect layer. According to an aspect of the present disclosure, the Mx-1 interconnect layer may be any of the M5-M7 interconnect layers.

A first set of vias 530 (e.g., a set of through finger vias) may electrically couple the first set of conductive fingers 510 of the first interconnect layer 514 to the second set of conductive fingers 520 of the second interconnect layer 524. For example, the first set of vias 530 may couple the Mx interconnect layer to the Mx-1 interconnect layer. The first set of vias 530 may be V5-V7 vias.

The first set of conductive fingers 510 may include a first subset of conductive fingers 510-1 with a first capacitor node 532 and a second subset of conductive fingers 510-2 with a second capacitor node 534. The second set of conductive fingers 520 may include a third subset of conductive fingers 520-1 with the second capacitor node 534 and a fourth subset of conductive fingers 520-2 with the first capacitor node 532. For example, the first capacitor node 532 is formed where the first subset of conductive fingers 510-1 overlaps with the fourth subset of conductive fingers 520-2, and the second capacitor node 534 is formed where the second subset of conductive fingers 510-2 overlaps with the third subset of conductive fingers 520-1.

According to an aspect of the present disclosure, the first set of conductive fingers 510 may be electrically coupled to the second set of conductive fingers 520 in a staggered configuration. For example, the first set of vias 530 may include a first subset of vias 530-1 and a second subset of vias 530-2. The first subset of vias 530-1 may couple the first subset of conductive fingers 510-1 to the third subset of conductive fingers 520-1, and the second subset of vias 530-2 may couple the second subset of conductive fingers 510-2 to the fourth subset of conductive fingers 520-2. For example, finger vias couple the first subset of conductive fingers 510-1 to the third subset of conductive fingers 520-1, and also couple the second subset of conductive fingers 510-2 to the fourth subset of conductive fingers 520-2.

The first subset of conductive fingers 510-1 and the second subset of conductive fingers 510-2 may be alternately arranged. The third subset of conductive fingers 520-1 and the fourth subset of conductive fingers 520-2 may also be alternately arranged.

The first set of conductive fingers 510 and the second set of conductive fingers 520 may have a same length or a different length. The first subset of conductive fingers 510-1 and the second subset of conductive fingers 510-2 may have a same length or a different length. The third subset of conductive fingers 520-1 and the fourth subset of conductive fingers 520-2 may also have a same length or a different length.

Referring to FIG. 5B, the second set of conductive fingers 520 having the second conductive pitch 522 at the second interconnect layer 524 may be coupled to a third set of conductive fingers 540 having a third conductive pitch 542 at a third interconnect layer 544 through a second set of vias 550. For example, the second set of vias 550 may be V1-V3 vias.

The third set of conductive fingers 540 may be arranged in the first unidirectional routing 516. Alternatively, the third set of conductive fingers 540 may be arranged in the second unidirectional routing 526. The third conductive pitch 542 may be the same or different from the first conductive pitch 512 and/or the second conductive pitch 522. For example, the third conductive pitch 542 may be equal to or greater than 200% of a width of the third set of conductive fingers 540. The third interconnect layer 544 may be an Mx-2 interconnect layer. According to an aspect of the present disclosure, the Mx-2 interconnect layer may be any of the M2-M4 interconnect layers.

The third set of conductive fingers 540 may include a fifth subset of conductive fingers 540-1 with a third capacitor node 552 and a sixth subset of conductive fingers 540-2 with a fourth capacitor node 554.

The third subset of conductive fingers 520-1 and the fifth subset of conductive fingers 540-1 may include the third capacitor node 552. The fourth subset of conductive fingers 520-2 and the sixth subset of conductive fingers 540-2 may include the fourth capacitor node 554. For example, the third capacitor node 552 is formed where the fourth subset of conductive fingers 520-2 overlaps with the fifth subset of conductive fingers 540-1, and the fourth capacitor node 554 is formed where the third subset of conductive fingers 520-1 overlaps with the sixth subset of conductive fingers 540-2.

According to an aspect of the present disclosure, the second set of conductive fingers 520 may be electrically coupled to the third set of conductive fingers 540 in a staggered configuration. For example, the second set of vias 550 may include a third subset of vias 550-1 and a fourth subset of vias 550-2. The third subset of vias 550-1 may couple the third subset of conductive fingers 520-1 to the fifth subset of conductive fingers 540-1, and the fourth subset of vias 550-2 may couple the fourth subset of conductive fingers 520-2 to the sixth set of conductive fingers 540-2.

Referring to FIG. 5C, the RTMOM 500 may include the third set of conductive fingers 540 having the third conductive pitch 542 at the third interconnect layer 544 and arranged in the first unidirectional routing 516. The RTMOM 500 may also include a fourth set of conductive fingers 560 having a fourth conductive pitch 562 at a fourth interconnect layer 564 and arranged in the second unidirectional routing 526. Alternatively, the fourth set of conductive fingers 560 may be arranged in the first unidirectional routing 516. The fourth conductive pitch 562 may be the same or different from the first conductive pitch 512 and/or the second conductive pitch 522. For example, the fourth conductive pitch 562 may be equal to or greater than 150% a width of the fourth set of conductive fingers 560. The fourth interconnect layer 564 may be an Mx-3 interconnect layer. According to an aspect of the present disclosure, the Mx-3 interconnect layer may be any of the M1-M3 interconnect layers. A third set of vias 570 may electrically couple the third set of conductive fingers 540 to the fourth set of conductive fingers 560. For example, the third set of vias 570 may be V1-V3 vias.

The third set of conductive fingers 540 may include the fifth subset of conductive fingers 540-1 with a fifth capacitor node 572 and the sixth subset of conductive fingers 540-2 with a sixth capacitor node 574. The fourth set of conductive fingers 560 may include a seventh subset of conductive fingers 560-1 with the fifth capacitor node 572 and an eighth subset of conductive fingers 560-2 with the sixth capacitor node 574. For example, the fifth capacitor node 572 is formed where the fifth subset of conductive fingers 540-1 overlaps with the eighth subset of conductive fingers 560-2, and the sixth capacitor node 574 is formed where the sixth subset of conductive fingers 540-2 overlaps with the seventh subset of conductive fingers 560-1.

According to an aspect of the present disclosure, the third set of conductive fingers 540 may be electrically coupled to the fourth set of conductive fingers 560 in a staggered configuration. For example, the third set of vias 570 may include a fifth subset of vias 570-1 and a sixth subset of vias 570-2. The fifth subset of vias 570-1 may couple the fifth subset of conductive fingers 540-1 to the seventh subset of conductive fingers 560-1, and the sixth subset of vias 570-2 may couple the sixth subset of conductive fingers 540-2 to the eighth set of conductive fingers 560-2.

The fifth subset of conductive fingers 540-1 and the sixth subset of conductive fingers 540-2 may be alternately arranged. The seventh subset of conductive fingers 560-1 and the eighth subset of conductive fingers 560-2 may also be alternately arranged.

The third set of conductive fingers 540 and the fourth set of conductive fingers 560 may have a same length or a different length. The fifth subset of conductive fingers 540-1 and the sixth subset of conductive fingers 540-2 may have a same length or a different length. The seventh subset of conductive fingers 560-1 and the eighth subset of conductive fingers 560-2 may also have a same length or a different length.

Figure 6A:
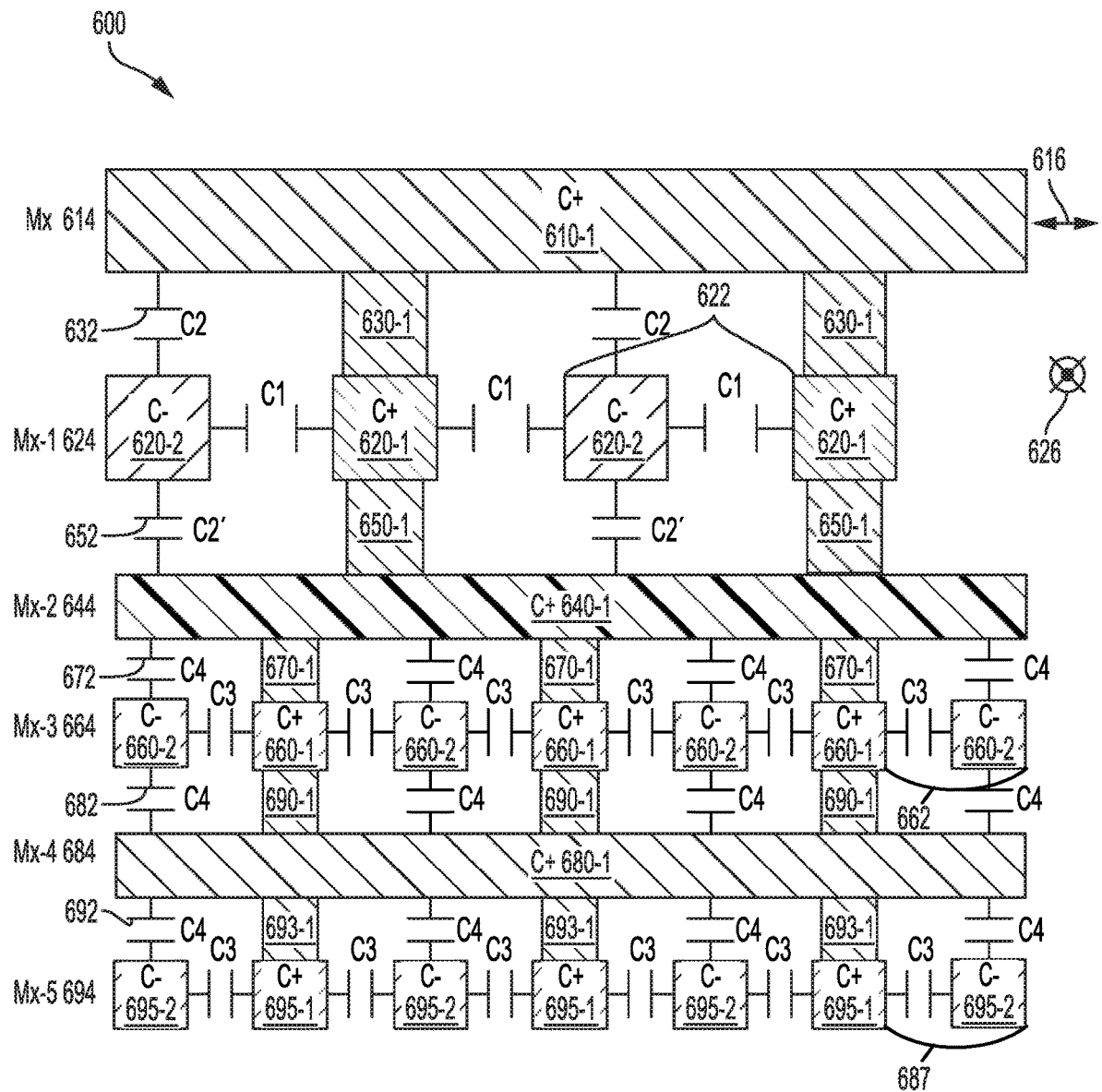
FIGS. 6A-6B illustrate cross-sectional side views of a rotated metal-oxide-metal (RTMOM) capacitor, according to aspects of the present disclosure.
Figure 6B:
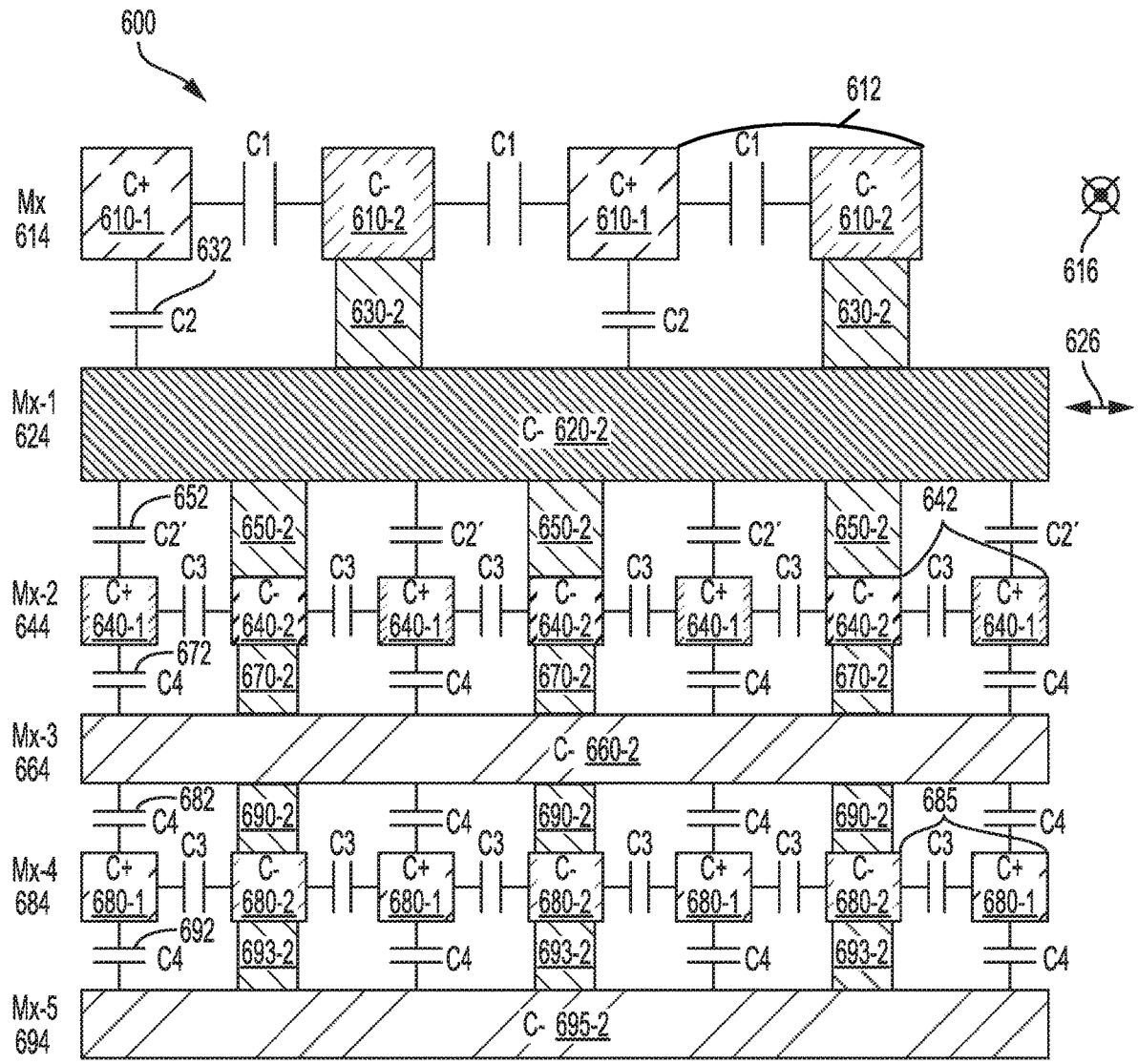

FIGS. 6A-6B illustrate cross-sectional side views of a rotated metal-oxide-metal (RTMOM) 600 (e.g., a capacitor), according to aspects of the present disclosure.

Referring to FIGS. 6A and 6B, a first set of conductive fingers 610 having a first conductive pitch 612 at a first interconnect layer 614 and arranged in a first unidirectional routing 616 is illustrated. For example, the first conductive pitch 612 may be 200% larger than a width of the first set of conductive fingers 610 and the first interconnect layer 614 may be an Mx interconnect layer. According to an aspect of the present disclosure, the Mx interconnect layer may be any of the M6-M8 interconnect layers.

The RTMOM 600 may further include a second set of conductive fingers 620 having a second conductive pitch 622 at a second interconnect layer 624 and arranged in a second unidirectional routing 626. For example, the second conductive pitch 622 may be the same or different from the first conductive pitch 612. According to an aspect of the present disclosure, the second conductive pitch 622 may be equal to or greater than 200% larger than a width of the second set of conductive fingers 620. The second unidirectional routing 626 may be orthogonal to the first unidirectional routing 616. The second interconnect layer 624 may be an Mx-1 interconnect layer. According to an aspect of the present disclosure, the Mx-1 interconnect layer may be any of the M5-M7 interconnect layers.

A first set of vias 630 (e.g., a set of through finger vias) may electrically couple the first set of conductive fingers 610 of the first interconnect layer 614 to the second set of conductive fingers 620 of the second interconnect layer 624. For example, the first set of vias 630 may couple the Mx interconnect layer to the Mx-1 interconnect layer. The first set of vias 630 may be V5-V7 vias.

The first set of conductive fingers 610 may include a first subset of conductive fingers 610-1 and a second subset of conductive fingers 610-2. Capacitors C1 having a first capacitance may be formed between the first subset of conductive fingers 610-1 and the second subset of conductive fingers 610-2. The second set of conductive fingers 620 may include a third subset of conductive fingers 620-1 and a fourth subset of conductive fingers 620-2. Capacitors C1 may also be formed between the third subset of conductive fingers 620-1 and the fourth subset of conductive fingers 620-2.

A first capacitor node 632 may be formed where the first subset of conductive fingers 610-1 overlaps with the fourth subset of conductive fingers 620-2. A second capacitor node (not shown) may be formed where the second subset of conductive fingers 610-2 overlaps with the third subset of conductive fingers 620-1. For example, the first capacitor node 632 and the second capacitor node may form capacitors C2 having a second capacitance.

According to an aspect of the present disclosure, the first set of conductive fingers 610 may be electrically coupled to the second set of conductive fingers 620 in a staggered configuration. For example, the first set of vias 630 may include a first subset of vias 630-1 and a second subset of vias 630-2. The first subset of vias 630-1 may couple the first subset of conductive fingers 610-1 to the third subset of conductive fingers 620-1, and the second subset of vias 630-2 may couple the second subset of conductive fingers 610-2 to the fourth subset of conductive fingers 620-2.

The first subset of conductive fingers 610-1 and the second subset of conductive fingers 610-2 may be alternately arranged. The third subset of conductive fingers 620-1 and the fourth subset of conductive fingers 620-2 may also be alternately arranged. For example, the first subset of conductive fingers 610-1 may be positively biased and the second subset of conductive fingers 610-2 may be negatively biased, and the third subset of conductive fingers 620-1 may be positively biased and the fourth subset of conductive fingers 620-2 may be negatively biased.

The second set of conductive fingers 620 may be coupled to a third set of conductive fingers 640 having a third conductive pitch 642 at a third interconnect layer 644 through a second set of vias 650. For example, the second set of vias 650 may be V4-V6 vias. As seen in FIG. 6B the first set of conductive fingers 610 is offset from the third set of conductive fingers 640.

The third set of conductive fingers 640 may be arranged in the first unidirectional routing 616. Alternatively, the third set of conductive fingers 640 may be arranged in the second unidirectional routing 626 (not shown). The third conductive pitch 642 may be the same or different from the first conductive pitch 612 and/or the second conductive pitch 622. For example, the third conductive pitch 642 may be equal to or greater than 200% of a width of the third set of conductive fingers 640. The third interconnect layer 644 may be an Mx-2 interconnect layer. According to an aspect of the present disclosure, the Mx-2 interconnect layer may be any of the M2-M4 interconnect layers.

The third set of conductive fingers 640 may include a fifth subset of conductive fingers 640-1 and a sixth subset of conductive fingers 640-2. Capacitors C3 having a third capacitance may be formed between the fifth subset of conductive fingers 640-1 and the sixth subset of conductive fingers 640-2.

A third capacitor node 652 may be formed where the fourth subset of conductive fingers 620-2 and the fifth subset of conductive fingers 640-1 overlap. A fourth capacitor node (not shown) may be formed where the third subset of conductive fingers 620-1 and the sixth subset of conductive fingers 640-2 overlap. For example, the third capacitor node 652 and the fourth capacitor node may form capacitors C2'.

According to an aspect of the present disclosure, the second set of conductive fingers 620 may be electrically coupled to the third set of conductive fingers 640 in a staggered configuration. For example, the second set of vias 650 may include a third subset of vias 650-1 and a fourth subset of vias 650-2. The third subset of vias 650-1 may couple the third subset of conductive fingers 620-1 to the fifth subset of conductive fingers 640-1, and the fourth subset of vias 650-2 may couple the fourth subset of conductive fingers 620-2 to the sixth set of conductive fingers 640-2.

The RTMOM 600 may include a fourth set of conductive fingers 660 having a fourth conductive pitch 662 at a fourth interconnect layer 664 and arranged in the second unidirectional routing 626. Alternatively, the fourth set of conductive fingers 660 may be arranged in the first unidirectional routing 616 (not shown). The fourth conductive pitch 662 may be the same or different from the first conductive pitch 612 and/or the second conductive pitch 622. For example, the fourth conductive pitch 662 may be equal to or greater than 200% of a width of the fourth set of conductive fingers 660. The fourth interconnect layer 664 may be an Mx-3 interconnect layer. According to an aspect of the present disclosure, the Mx-3 interconnect layer may be any of the M1-M3 interconnect layers. A third set of vias 670 may electrically couple the third set of conductive fingers 640 to the fourth set of conductive fingers 660. For example, the third set of vias 670 may be V1-V3 vias.

The fourth set of conductive fingers 660 may include a seventh subset of conductive fingers 660-1 and an eighth subset of conductive fingers 660-2. Capacitors C3 may be formed between the seventh subset of conductive fingers 660-1 and the eighth subset of conductive fingers 660-2. The fourth set of conductive fingers 660 are offset from the second set of conductive fingers 620, as seen in FIG. 6A.

A fifth capacitor node 672 may be formed where the fifth subset of conductive fingers 640-1 overlaps with the eighth subset of conductive fingers 660-2. A sixth capacitor node (not shown) may be formed where the sixth subset of conductive fingers 640-2 overlaps with the seventh subset of conductive fingers 660-1. For example, the fifth capacitor node 672 and the seventh capacitor node may form capacitors C4 having a fourth capacitance. As described, the capacitors C1-C4 may have the same or different capacitances.

The third set of vias 670 may include a fifth subset of vias 670-1 and a sixth subset of vias 670-2. The fifth subset of vias 670-1 may couple the fifth subset of conductive fingers 640-1 to the seventh subset of conductive fingers 660-1, and the sixth subset of vias 670-2 may couple the sixth subset of conductive fingers 640-2 to the eighth set of conductive fingers 660-2.

The fifth subset of conductive fingers 640-1 and the sixth subset of conductive fingers 640-2 may be alternately arranged. The seventh subset of conductive fingers 660-1 and the eighth subset of conductive fingers 660-2 may also be alternately arranged. For example, the fifth subset of conductive fingers 640-1 may be positively biased and the sixth subset of conductive fingers 640-2 may be negatively biased, and the seventh subset of conductive fingers 660-1 may be positively biased and the eighth subset of conductive fingers 660-2 may be negatively biased.

The fourth set of conductive fingers 660 may be coupled to a fifth set of conductive fingers 680 having a fifth conductive pitch 685 at a fifth interconnect layer 684 through a fourth set of vias 690. For example, the fourth set of vias 690 may be V2-V4 vias.

The fifth set of conductive fingers 680 may be arranged in the first unidirectional routing 616 or the second unidirectional routing 626. The fifth conductive pitch 685 may be the same or different from the third conductive pitch 642. For example, the fifth conductive pitch 685 may be equal to or greater than 200% a width of the fifth set of conductive fingers 680. The fifth interconnect layer 684 may be an Mx-4 interconnect layer. According to an aspect of the present disclosure, the Mx-4 interconnect layer may be any of the M2-M4 interconnect layers.

The fifth set of conductive fingers 680 may include a ninth subset of conductive fingers 680-1 and a tenth subset of conductive fingers 680-2. Capacitors C3 may be formed between the ninth subset of conductive fingers 680-1 and the tenth subset of conductive fingers 680-2.

A seventh capacitor node 682 may be formed where the eighth subset of conductive fingers 660-2 and the ninth subset of conductive fingers 680-1 overlap. An eighth capacitor node (not shown) may be formed where the seventh subset of conductive fingers 660-1 and the tenth subset of conductive fingers 680-2 overlap. For example, the seventh capacitor node 682 and the eighth capacitor node may form capacitors C4.

According to an aspect of the present disclosure, the fourth set of conductive fingers 660 may be electrically coupled to the fifth set of conductive fingers 680 in a staggered configuration. For example, the fourth set of vias 690 may include a seventh subset of vias 690-1 and an eighth subset of vias 690-2. The seventh subset of vias 690-1 may couple the seventh subset of conductive fingers 660-1 to the ninth subset of conductive fingers 680-1, and the eighth subset of vias 690-2 may couple the eighth subset of conductive fingers 660-2 to the tenth set of conductive fingers 680-2.

The ninth subset of conductive fingers 680-1 and the tenth subset of conductive fingers 680-2 may also be alternately arranged. For example, the ninth subset of conductive fingers 680-1 may be positively biased and the tenth subset of conductive fingers 680-2 may be negatively biased.

The RTMOM 600 may include a sixth set of conductive fingers 695 having a sixth conductive pitch 687 at a sixth interconnect layer 694 and arranged in the second unidirectional routing 626 or the first unidirectional routing 616. The sixth conductive pitch 687 may be the same or different from the fifth conductive pitch 685. For example, the sixth conductive pitch 687 may be equal to or greater than 200% of a width of the sixth set of conductive fingers 695. The sixth interconnect layer 694 may be an Mx-5 interconnect layer. According to an aspect of the present disclosure, the Mx-5 interconnect layer may be any of the M1-M3 interconnect layers. A fifth set of vias 693 may electrically couple the fifth set of conductive fingers 680 to the sixth set of conductive fingers 695. For example, the fifth set of vias 693 may be V1-V3 vias.

The sixth set of conductive fingers 695 may include an eleventh subset of conductive fingers 695-1 and a twelfth subset of conductive fingers 695-2. Capacitors C3 may be formed between the eleventh subset of conductive fingers 695-1 and the twelfth subset of conductive fingers 695-2.

A ninth capacitor node 692 may be formed where the ninth subset of conductive fingers 680-1 overlaps with the twelfth subset of conductive fingers 695-2. A tenth capacitor node (not shown) may be formed where the tenth subset of conductive fingers 680-2 overlaps with the eleventh subset of conductive fingers 695-1. For example, the ninth capacitor node 692 may form capacitors C4.

The fifth set of vias 693 may include a ninth subset of vias 693-1 and a tenth subset of vias 693-2. The ninth subset of vias 693-1 may couple the ninth subset of conductive fingers 680-1 to the eleventh subset of conductive fingers 695-1, and the tenth subset of vias 693-2 may couple the tenth subset of conductive fingers 680-2 to the twelfth subset of conductive fingers 695-2.

The eleventh subset of conductive fingers 695-1 and the twelfth subset of conductive fingers 695-2 may be alternately arranged. For example, the eleventh subset of conductive fingers 695-1 may be positively biased and the twelfth subset of conductive fingers 695-2 may be negatively biased.

According to additional aspects of the present disclosure, additional interconnect layers may be added above or below the interconnect layers (e.g., 614-694). These additional interconnect layers may be arranged in a similar configuration as any of the individual interconnect layers (e.g., 614-694), as described herein.

Figure 7:
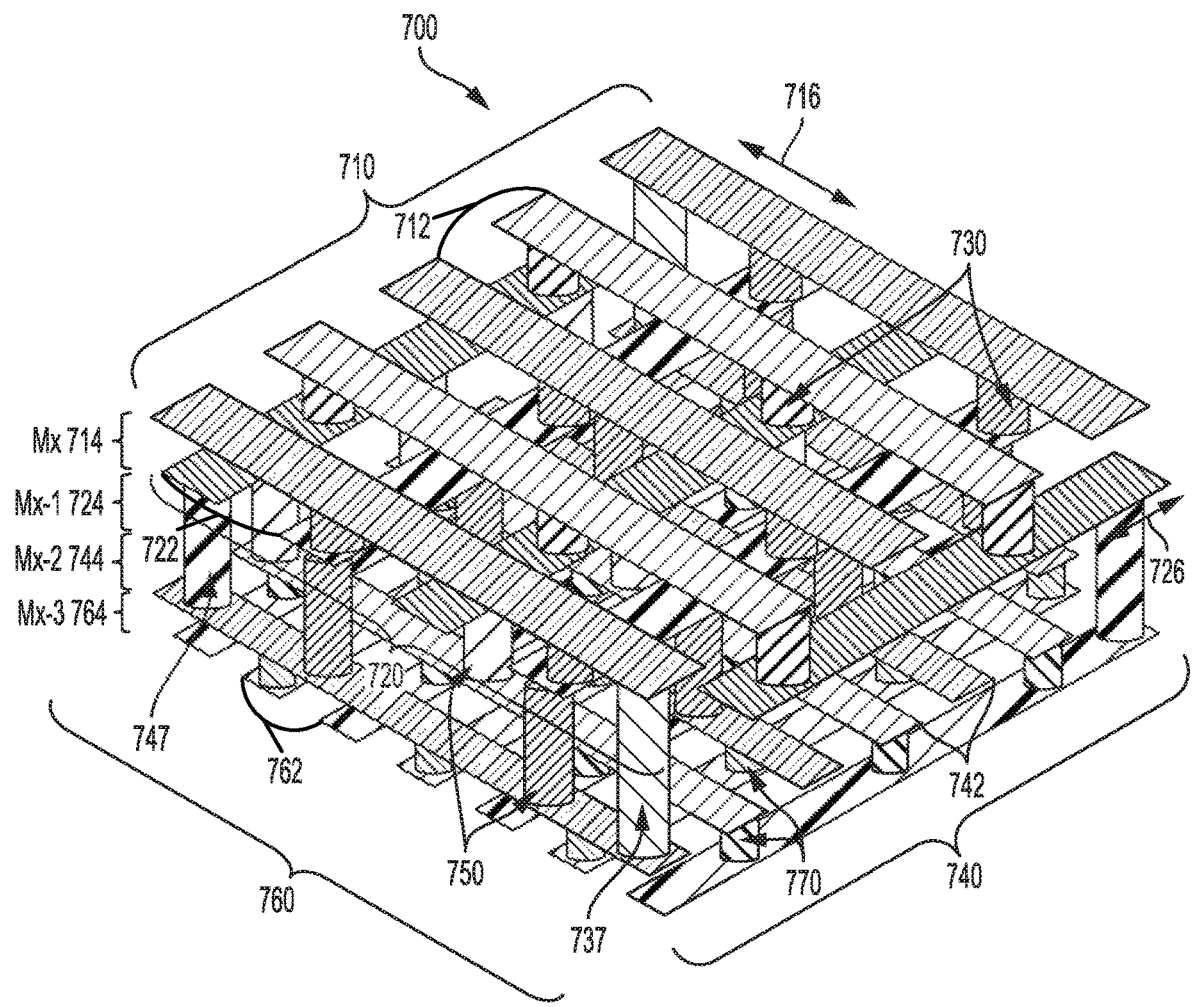
FIG. 7 illustrates a perspective view of a rotated metal-oxide-metal (RTMOM) capacitor structure, according to aspects of the present disclosure.

FIG. 7 illustrates a perspective view of a rotated metal-oxide-metal (RTMOM) 700 capacitor structure, according to aspects of the present disclosure. The RTMOM 700 may include a metal-insulator-metal (MIM) capacitor. The RTMOM 700 may be configured substantially similar to the RTMOM 400 described above in FIG. 4, and may further include a first set of super-vias 737 and a second set of super-vias 747.

The RTMOM 700 may include a first set of conductive fingers 710 having a first conductive pitch 712 at a first interconnect layer 714 and arranged in a first unidirectional routing 716. For example, the first conductive pitch 712 may be 200% greater than a width of the first set of conductive fingers 710 and the first interconnect layer 714 may be an Mx interconnect layer. According to an aspect of the present disclosure, the Mx interconnect layer may be any of the M6-M8 interconnect layers.

The RTMOM 700 may further include a second set of conductive fingers 720 having a second conductive pitch 722 at a second interconnect layer 724 and arranged in a second unidirectional routing 726. For example, the second conductive pitch 722 may be the same or different from the first conductive pitch 712. According to an aspect of the present disclosure, the second conductive pitch 722 may be equal to or greater than 200% of a width of the second set of conductive fingers 720. The second unidirectional routing 726 may be orthogonal to the first unidirectional routing 716. The second interconnect layer 724 may be an Mx-1 interconnect layer. According to an aspect of the present disclosure, the Mx-1 interconnect layer may be any of the M5-M7 interconnect layers.

A first set of vias 730 (e.g., a set of through finger vias) may electrically couple the first set of conductive fingers 710 of the first interconnect layer 714 to the second set of conductive fingers 720 of the second interconnect layer 724. For example, the first set of vias 730 may couple the Mx interconnect layer to the Mx-1 interconnect layer. The first set of vias 730 may be V5-V7 vias.

The RTMOM 700 may include a third set of conductive fingers 740 having a third conductive pitch 742 at a third interconnect layer 744 and arranged in the first unidirectional routing 716. Alternatively, the third set of conductive fingers 740 may be arranged in the second unidirectional routing 726. The third conductive pitch 742 may be the same or different from the first conductive pitch 712 and the second conductive pitch 722. For example, the third conductive pitch 742 may be equal to or greater than 200% of a width of the third set of conductive fingers 740. The third interconnect layer 744 may be an Mx-2 interconnect layer. According to an aspect of the present disclosure, the Mx-2 interconnect layer may be any of the M2-M4 interconnect layers. A second set of vias 750 may electrically couple the second set of conductive fingers 720 to the third set of conductive fingers 740. For example, the second set of vias 750 may be V2-V4 vias.

The first set of super-vias 737 may couple the first set of conductive fingers 710 to the third set of conductive fingers 740. For example, the first set of super-vias 737 may extend from the first interconnect layer 714 to the third interconnect layer 744. The first set of super-vias 737 may include V6-V7 vias.

According to aspects of the present disclosure, a finger via (e.g., a super-via) of the first set of super-vias 737 may couple a conductive finger of the third set of conductive fingers 740 to a conductive finger of the first set of conductive fingers 710.

The RTMOM 700 may include a fourth set of conductive fingers 760 having a fourth conductive pitch 762 at a fourth interconnect layer 764 and arranged in the second unidirectional routing 726. Alternatively, the fourth set of conductive fingers 760 may be arranged in the first unidirectional routing 716. The fourth conductive pitch 762 may be the same or different from the first conductive pitch 712 and the second conductive pitch 722. For example, the fourth conductive pitch 762 may be equal to or greater than 200% of a width of the fourth set of conductive fingers 760. The fourth interconnect layer 764 may be an Mx-3 interconnect layer. According to an aspect of the present disclosure, the Mx-3 interconnect layer may be any of the M1-M3 interconnect layers. A third set of vias 770 may electrically couple the third set of conductive fingers 740 to the fourth set of conductive fingers 760. For example, the third set of vias 770 may be V1-V3 vias.

The second set of super-vias 747 may couple the second set of conductive fingers 720 to the fourth set of conductive fingers 760. For example, the second set of super-vias 747 may extend from the second interconnect layer 724 to the fourth interconnect layer 764. The second set of super-vias 747 may include V5-V6 vias.

Figure 8A:
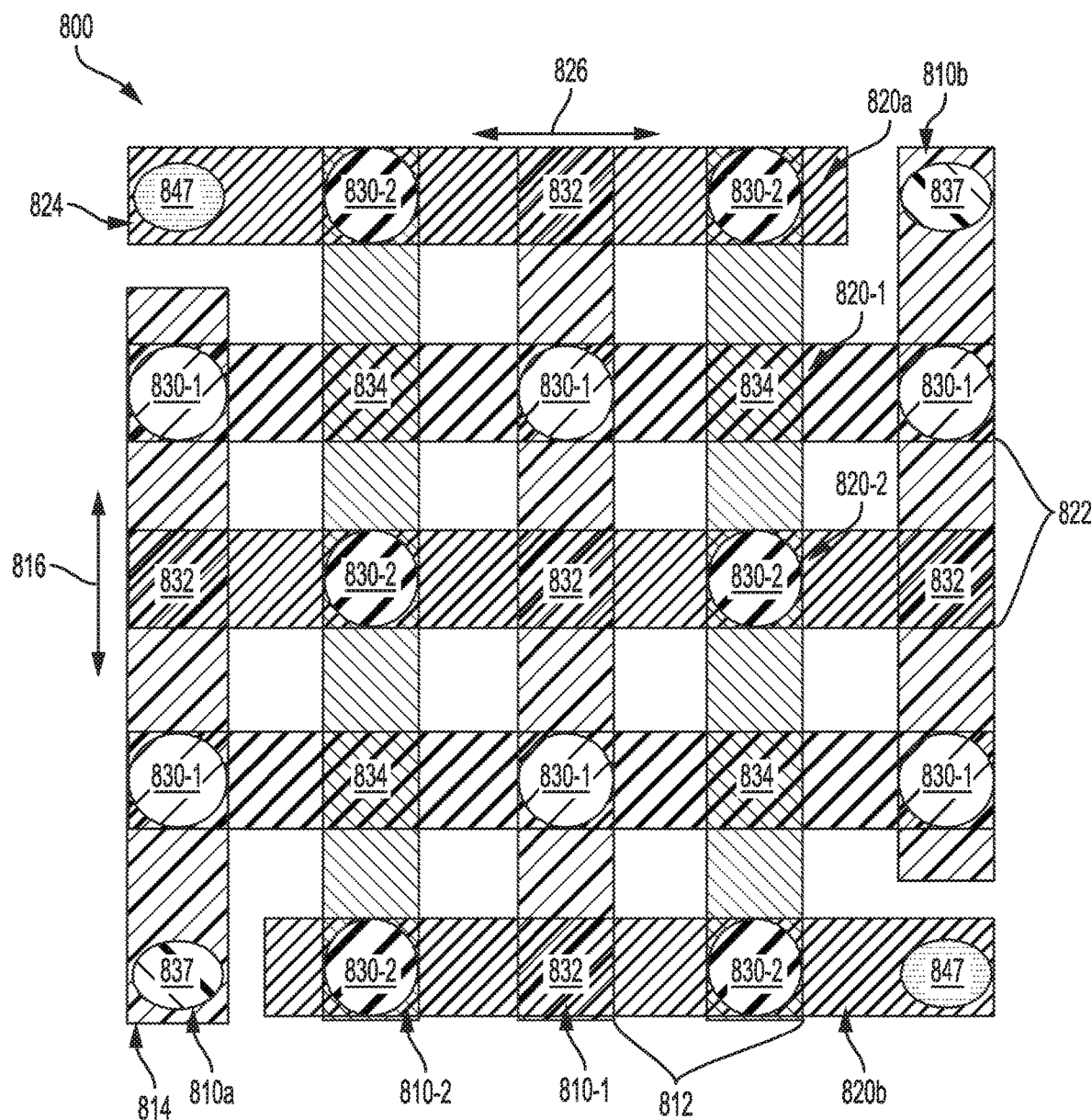
FIGS. 8A-8C illustrate top views of a rotated metal-oxide-metal (RTMOM) capacitor, according to aspects of the present disclosure.
Figure 8B:
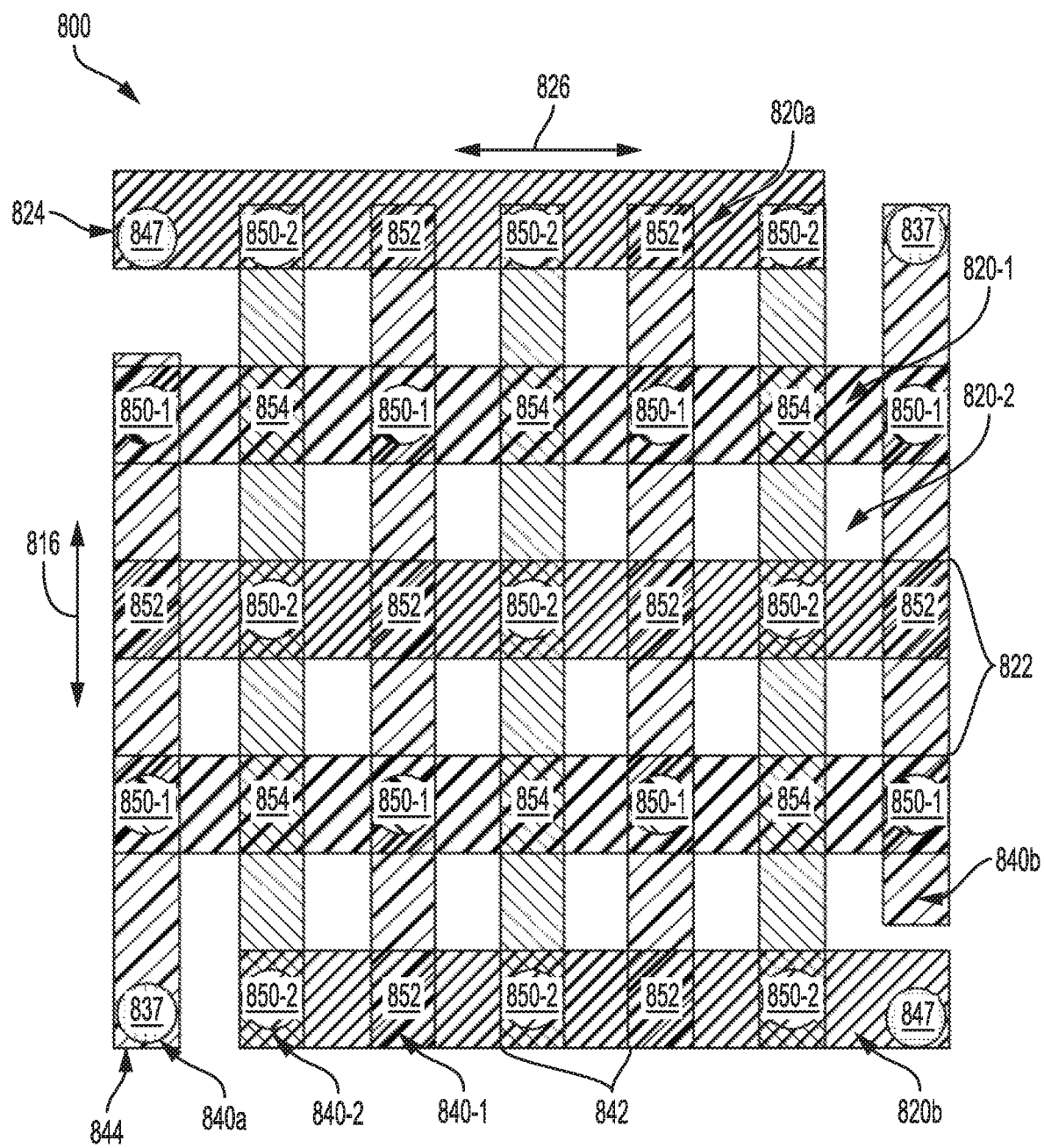
Figure 8C:
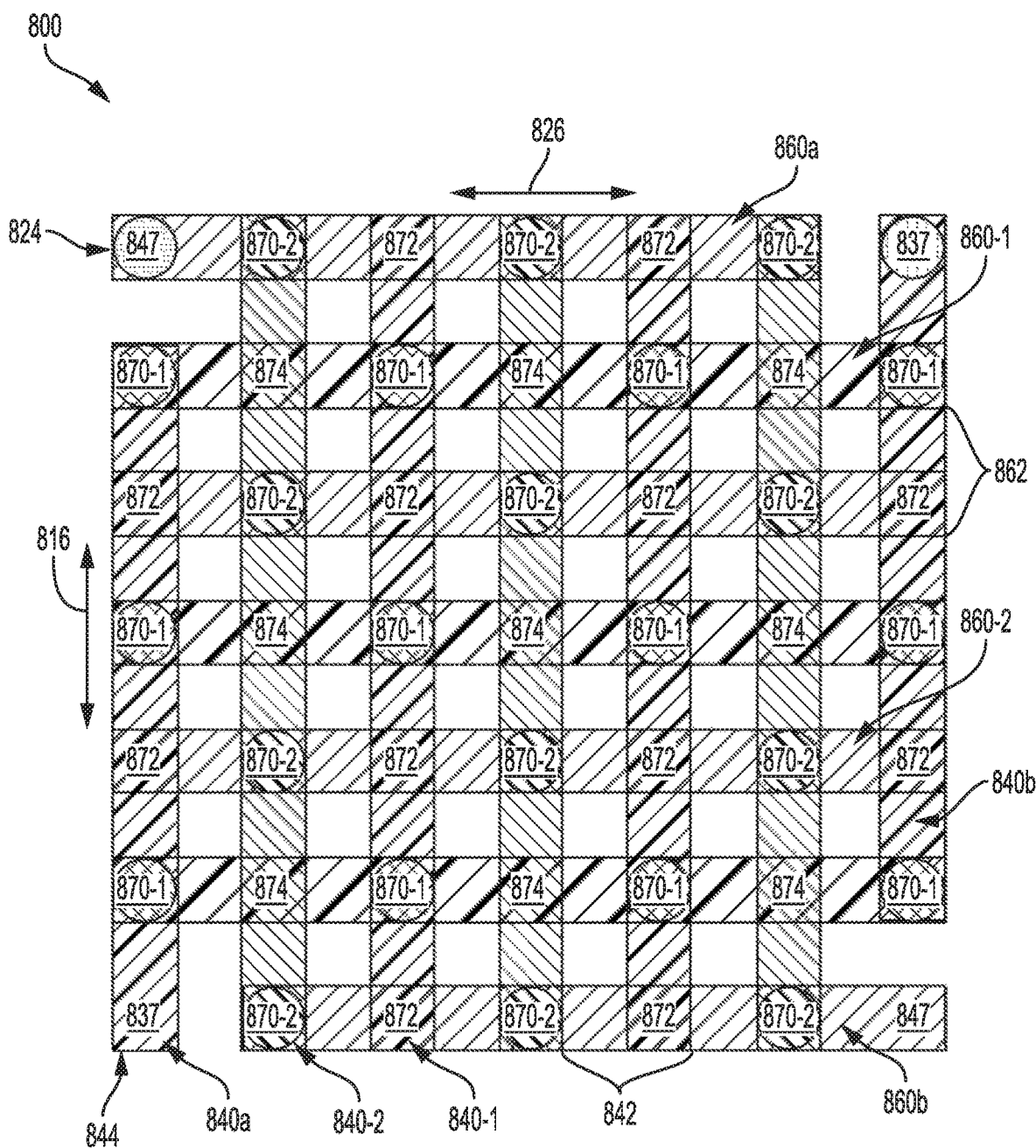

FIGS. 8A-8C illustrate top views of a rotated metal-oxide-metal (RTMOM) 800 (e.g., a capacitor), according to aspects of the present disclosure. Referring to FIG. 8A, a first set of conductive fingers 810 having a first conductive pitch 812 at a first interconnect layer 814 and arranged in a first unidirectional routing 816 is illustrated. For example, the first conductive pitch 812 may be 200% greater than a width of the first set of conductive fingers 810 and the first interconnect layer 814 may be an Mx interconnect layer. According to an aspect of the present disclosure, the Mx interconnect layer may be any of the M6-M8 interconnect layers.

The RTMOM 800 may further include a second set of conductive fingers 820 having a second conductive pitch 822 at a second interconnect layer 824 and arranged in a second unidirectional routing 826. For example, the second conductive pitch 822 may be the same or different from the first conductive pitch 812. According to an aspect of the present disclosure, the second conductive pitch 822 may be equal to or greater than 200% of a width of the second set of conductive fingers 820. The second unidirectional routing 826 may be orthogonal to the first unidirectional routing 816. The second interconnect layer 824 may be an Mx-1 interconnect layer. According to an aspect of the present disclosure, the Mx-1 interconnect layer may be any of the M5-M7 interconnect layers.

A first set of vias 830 (e.g., a set of through finger vias) may electrically couple the first set of conductive fingers 810 of the first interconnect layer 814 to the second set of conductive fingers 820 of the second interconnect layer 824. For example, the first set of vias 830 may couple the Mx interconnect layer to the Mx-1 interconnect layer. The first set of vias 830 may be V5-V7 vias.

The first set of conductive fingers 810 may include a first subset of conductive fingers 810-1 with a first capacitor node 832 and a second subset of conductive fingers 810-2 with a second capacitor node 834. The second set of conductive fingers 820 may include a third subset of conductive fingers 820-1 with the second capacitor node 834 and a fourth subset of conductive fingers 820-2 with the first capacitor node 832. For example, the first capacitor node 832 is formed where the first subset of conductive fingers 810-1 overlaps with the fourth subset of conductive fingers 820-2, and the second capacitor node 834 is formed where the second subset of conductive fingers 810-2 overlaps with the third subset of conductive fingers 820-1.

The first subset of conductive fingers 810-1 may include a first shortened finger 810a and a second shortened finger 810b. For example, the first shortened finger 810a and the second shortened finger 810b may be shorter than a length of the second subset of conductive fingers 810-2. The first shortened finger 810a and the second shortened finger 810b may extend until, but not cross over, a third shortened finger 820a and a fourth shortened finger 820b, respectively. A first set of super-vias 837 may be coupled to the first shortened finger 810a and the second shortened finger 810b.

The third subset of conductive fingers 820-1 may include the third shortened finger 820a and the fourth shortened finger 820b. For example, the third shortened finger 820a and the fourth shortened finger 820b may be shorter than a length of the fourth subset of conductive fingers 820-2. The third shortened finger 820a and the fourth shortened finger 820b may extend until, but not cross under, the first shortened finger 810a and the second shortened finger 810b, respectively. A second set of super-vias 847 may be coupled to the third shortened finger 820a and the fourth shortened finger 820b.

According to an aspect of the present disclosure, the first set of conductive fingers 810 may be electrically coupled to the second set of conductive fingers 820 in a staggered configuration. For example, the first set of vias 830 may include a first subset of vias 830-1 and a second subset of vias 830-2. The first subset of vias 830-1 may couple the first subset of conductive fingers 810-1 to the third subset of conductive fingers 820-1, and the second subset of vias 830-2 may couple the second subset of conductive fingers 810-2 to the fourth subset of conductive fingers 820-2.

The first subset of conductive fingers 810-1 and the second subset of conductive fingers 810-2 may be alternately arranged. The third subset of conductive fingers 820-1 and the fourth subset of conductive fingers 820-2 may also be alternately arranged.

Referring to FIG. 8B, the second set of conductive fingers 820 having the second conductive pitch 822 at the second interconnect layer 824 may be coupled to a third set of conductive fingers 840 having a third conductive pitch 842 at a third interconnect layer 844 through a second set of vias 850. For example, the second set of vias 850 may be V4-V6 vias.

The third set of conductive fingers 840 may be arranged in the first unidirectional routing 816. Alternatively, the third set of conductive fingers 840 may be arranged in the second unidirectional routing 826. The third conductive pitch 842 may be the same or different from the first conductive pitch 812 and the second conductive pitch 822. For example, the third conductive pitch 842 may be equal to or greater than 200% of a width of the third set of conductive fingers 840. The third interconnect layer 844 may be an Mx-2 interconnect layer. According to an aspect of the present disclosure, the Mx-2 interconnect layer may be any of the M2-M4 interconnect layers.

The third set of conductive fingers 840 may include a fifth subset of conductive fingers 840-1 with a third capacitor node 852 and a sixth subset of conductive fingers 840-2 with a fourth capacitor node 854.

The third subset of conductive fingers 820-1 and the fifth subset of conductive fingers 840-1 may include the third capacitor node 852. The fourth subset of conductive fingers 820-2 and the sixth subset of conductive fingers 840-2 may include the fourth capacitor node 854. For example, the third capacitor node 852 is formed where the fourth subset of conductive fingers 820-2 overlaps with the fifth subset of conductive fingers 840-1, and the fourth capacitor node 854 is formed where the third subset of conductive fingers 820-1 overlaps with the sixth subset of conductive fingers 840-2.

The sixth subset of conductive fingers 840-2 may include a fifth shortened finger 840a and a sixth shortened finger 840b. For example, the fifth shortened finger 840a and the sixth shortened finger 840b may be shorter than a length of the fifth subset of conductive fingers 840-1. The fifth shortened finger 840a and the sixth shortened finger 840b may extend until, but not cross under, the third shortened finger 820a and the fourth shortened finger 820b, respectively. The first set of super-vias 837 may be coupled to the fifth shortened finger 840a and the sixth shortened finger 840b. In this way, the first shortened finger 810a and the second shortened finger 810b (in FIG. 8A) may be coupled to the fifth shortened finger 840a and the sixth shortened finger 840b, respectively.

According to an aspect of the present disclosure, the second set of conductive fingers 820 may be electrically coupled to the third set of conductive fingers 840 in a staggered configuration. For example, the second set of vias 850 may include a third subset of vias 850-1 and a fourth subset of vias 850-2. The third subset of vias 850-1 may couple the third subset of conductive fingers 820-1 to the fifth subset of conductive fingers 840-1, and the fourth subset of vias 850-2 may couple the fourth subset of conductive fingers 820-2 to the sixth set of conductive fingers 840-2.

Referring to FIG. 8C, the RTMOM 800 may include the third set of conductive fingers 840 having the third conductive pitch 842 at the third interconnect layer 844 and arranged in the first unidirectional routing 816. The RTMOM 800 may include a fourth set of conductive fingers 860 having a fourth conductive pitch 862 at a fourth interconnect layer 864 and arranged in the second unidirectional routing 826. Alternatively, the fourth set of conductive fingers 860 may be arranged in the first unidirectional routing 816. The fourth conductive pitch 862 may be the same or different from the first conductive pitch 812 and the second conductive pitch 822. For example, the fourth conductive pitch 862 may be equal to or greater than 200% of a width of the fourth set of conductive fingers 860. The fourth interconnect layer 864 may be an Mx-3 interconnect layer. According to an aspect of the present disclosure, the Mx-3 interconnect layer may be any of the M1-M3 interconnect layers. A third set of vias 870 may electrically couple the third set of conductive fingers 840 to the fourth set of conductive fingers 860. For example, the third set of vias 870 may be V1-V3 vias.

The third set of conductive fingers 840 may include the fifth subset of conductive fingers 840-1 with a fifth capacitor node 872 and the sixth subset of conductive fingers 840-2 with a sixth capacitor node 874. The fourth set of conductive fingers 860 may include a seventh subset of conductive fingers 860-1 with the fifth capacitor node 872 and an eighth subset of conductive fingers 860-2 with the sixth capacitor node 874. For example, the fifth capacitor node 872 is formed where the fifth subset of conductive fingers 840-1 overlaps with the eighth subset of conductive fingers 860-2, and the sixth capacitor node 874 is formed where the sixth subset of conductive fingers 840-2 overlaps with the seventh subset of conductive fingers 860-1.

The eighth subset of conductive fingers 860-2 may include a seventh shortened finger 860a and an eighth shortened finger 860b. For example, the seventh shortened finger 860a and the eighth shortened finger 860b may be shorter than a length of the seventh subset of conductive fingers 860-1. The fifth shortened finger 840a and the sixth shortened finger 840b may extend until, but not cross over, the seventh shortened finger 860a and the eighth shortened finger 860b, respectively. The first set of super-vias 837 may be coupled to the fifth shortened finger 840a and the sixth shortened finger 840b.

The second set of super-vias 847 may be coupled to the seventh shortened finger 860a and the eighth shortened finger 860b. In this way, the third shortened finger 820a and the fourth shortened finger 820b (in FIG. 8B) may be coupled to the seventh shortened finger 860a and the eighth shortened finger 860b, respectively.

According to an aspect of the present disclosure, the third set of conductive fingers 840 may be electrically coupled to the fourth set of conductive fingers 860 in a staggered configuration. For example, the third set of vias 870 may include a fifth subset of vias 870-1 and a sixth subset of vias 870-2. The fifth subset of vias 870-1 may couple the fifth subset of conductive fingers 840-1 to the seventh subset of conductive fingers 860-1, and the sixth subset of vias 870-2 may couple the sixth subset of conductive fingers 840-2 to the eighth set of conductive fingers 860-2.

The fifth subset of conductive fingers 840-1 and the sixth subset of conductive fingers 840-2 may be alternately arranged. The seventh subset of conductive fingers 860-1 and the eighth subset of conductive fingers 860-2 may also be alternately arranged.

According to an aspect of the present disclosure, a shape of the conductive layers as viewed from the top views of FIGS. 8A-8C may be a windmill shape.

Figure 9A:
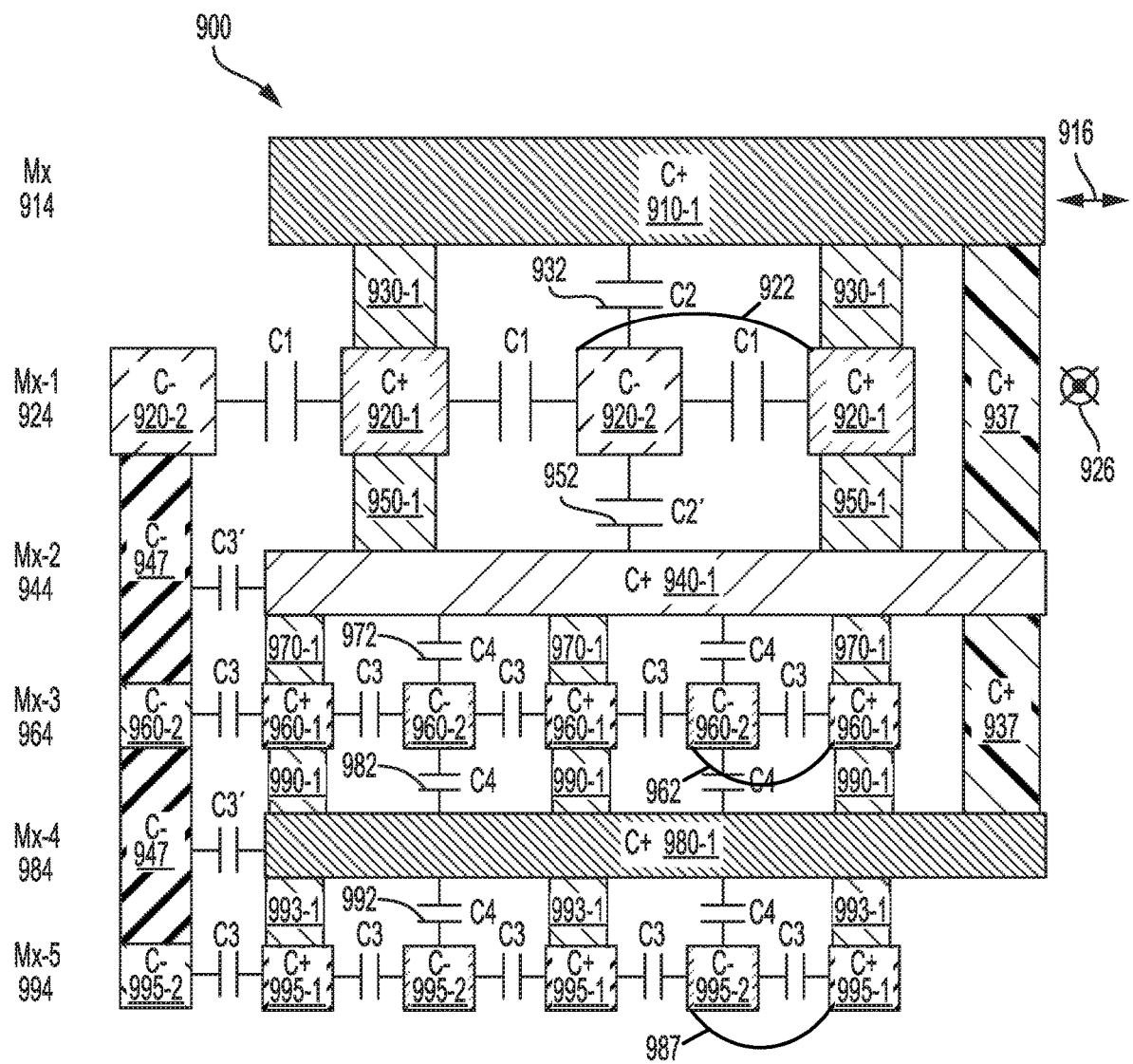
FIGS. 9A-9B illustrate cross-sectional side views of a rotated metal-oxide-metal (RTMOM) capacitor, according to aspects of the present disclosure.
Figure 9B:
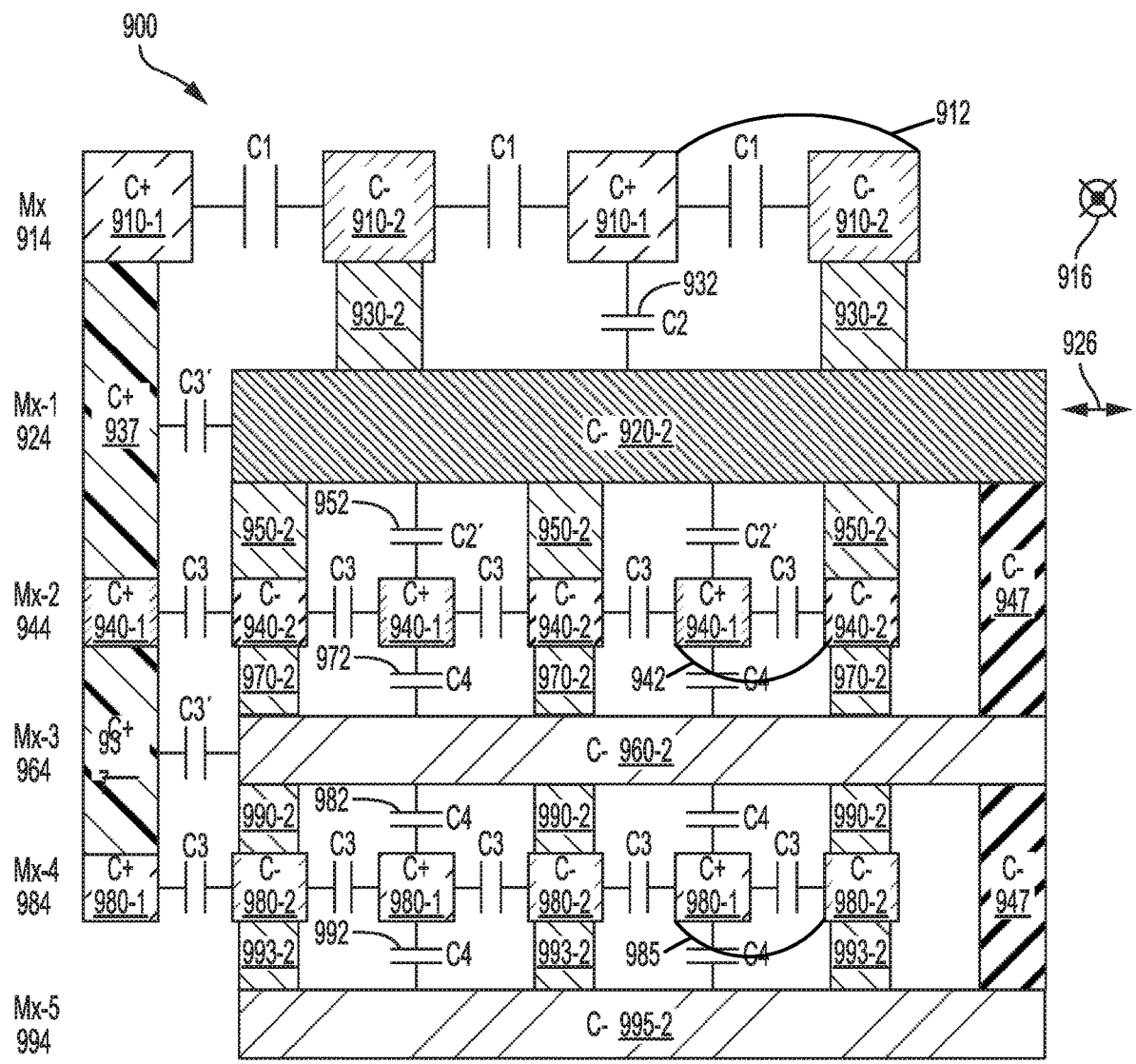

FIGS. 9A-9B illustrate cross-sectional side views of a rotated metal-oxide-metal (RTMOM) 900 (e.g., a capacitor), according to aspects of the present disclosure.

Referring to FIGS. 9A and 9B, a first set of conductive fingers 910 having a first conductive pitch 912 at a first interconnect layer 914 and arranged in a first unidirectional routing 916 is illustrated. For example, the first conductive pitch 912 may be 200% greater than a width of the first set of conductive fingers 910 and the first interconnect layer 914 may be an Mx interconnect layer. According to an aspect of the present disclosure, the Mx interconnect layer may be any of the M6-M8 interconnect layers.

The RTMOM 900 may further include a second set of conductive fingers 920 having a second conductive pitch 922 at a second interconnect layer 924 and arranged in a second unidirectional routing 926. For example, the second conductive pitch 922 may be the same or different from the first conductive pitch 912. According to an aspect of the present disclosure, the second conductive pitch 922 may be equal to or greater than 200% of a width of the second set of conductive fingers 920. The second unidirectional routing 926 may be orthogonal to the first unidirectional routing 916. The second interconnect layer 924 may be an Mx-1 interconnect layer. According to an aspect of the present disclosure, the Mx-1 interconnect layer may be any of the M5-M7 interconnect layers.

A first set of vias 930 (e.g., a set of through finger vias) may electrically couple the first set of conductive fingers 910 of the first interconnect layer 914 to the second set of conductive fingers 920 of the second interconnect layer 924. For example, the first set of vias 930 may couple the Mx interconnect layer to the Mx-1 interconnect layer. The first set of vias 930 may be V5-V7 vias.

The first set of conductive fingers 910 may include a first subset of conductive fingers 910-1 and a second subset of conductive fingers 910-2. Capacitors C1 having a first capacitance may be formed between the first subset of conductive fingers 910-1 and the second subset of conductive fingers 910-2. The second set of conductive fingers 920 may include a third subset of conductive fingers 920-1 and a fourth subset of conductive fingers 920-2. Capacitors C1 may also be formed between the third subset of conductive fingers 920-1 and the fourth subset of conductive fingers 920-2.

A first capacitor node 932 may be formed where the first subset of conductive fingers 910-1 overlaps with the fourth subset of conductive fingers 920-2. A second capacitor node (not shown) may be formed where the second subset of conductive fingers 910-2 overlaps with the third subset of conductive fingers 920-1. For example, the first capacitor node 932 and the second capacitor node may form capacitors C2 having a second capacitance.

According to an aspect of the present disclosure, the first set of conductive fingers 910 may be electrically coupled to the second set of conductive fingers 920 in a staggered configuration. For example, the first set of vias 930 may include a first subset of vias 930-1 and a second subset of vias 930-2. The first subset of vias 930-1 may couple the first subset of conductive fingers 910-1 to the third subset of conductive fingers 920-1, and the second subset of vias 930-2 may couple the second subset of conductive fingers 910-2 to the fourth subset of conductive fingers 920-2.

The first subset of conductive fingers 910-1 and the second subset of conductive fingers 910-2 may be alternately arranged. The third subset of conductive fingers 920-1 and the fourth subset of conductive fingers 920-2 may also be alternately arranged. For example, the first subset of conductive fingers 910-1 may be positively biased and the second subset of conductive fingers 910-2 may be negatively biased, and the third subset of conductive fingers 920-1 may be positively biased and the fourth subset of conductive fingers 920-2 may be negatively biased.

The second set of conductive fingers 920 may be coupled to a third set of conductive fingers 940 having a third conductive pitch 942 at a third interconnect layer 944 through a second set of vias 950. For example, the second set of vias 950 may be V4-V6 vias.

The third set of conductive fingers 940 may be arranged in the first unidirectional routing 916. Alternatively, the third set of conductive fingers 940 may be arranged in the second unidirectional routing 926. The third conductive pitch 942 may be the same or different from the first conductive pitch 912 and the second conductive pitch 922. For example, the third conductive pitch 942 may be equal to or greater than 200% of a width of the third set of conductive fingers 940. The third interconnect layer 944 may be an Mx-2 interconnect layer. According to an aspect of the present disclosure, the Mx-2 interconnect layer may be any of the M2-M4 interconnect layers.

The third set of conductive fingers 940 may include a fifth subset of conductive fingers 940-1 and a sixth subset of conductive fingers 940-2. Capacitors C3 having a third capacitance may be formed between the fifth subset of conductive fingers 940-1 and the sixth subset of conductive fingers 940-2.

A third capacitor node 952 may be formed where the fourth subset of conductive fingers 920-2 and the fifth subset of conductive fingers 940-1 overlap. A fourth capacitor node (not shown) may be formed where the third subset of conductive fingers 920-1 and the sixth subset of conductive fingers 940-2 overlap. For example, the third capacitor node 952 and the fourth capacitor node may form capacitors C2'.

According to an aspect of the present disclosure, the second set of conductive fingers 920 may be electrically coupled to the third set of conductive fingers 940 in a staggered configuration. For example, the second set of vias 950 may include a third subset of vias 950-1 and a fourth subset of vias 950-2. The third subset of vias 950-1 may couple the third subset of conductive fingers 920-1 to the fifth subset of conductive fingers 940-1, and the fourth subset of vias 950-2 may couple the fourth subset of conductive fingers 920-2 to the sixth set of conductive fingers 940-2.

A first set of super-vias 937 may couple the first set of conductive fingers 910 to the third set of conductive fingers 940. For example, the first set of super-vias 937 may couple one of the first subset of conductive fingers 910-1 to one of the fifth subset of conductive fingers 940-1. A capacitance C3' may be between the first set of super-vias 937 and one of the fourth subset of conductive fingers 920-2.

The RTMOM 900 may include a fourth set of conductive fingers 960 having a fourth conductive pitch 962 at a fourth interconnect layer 964 and arranged in the second unidirectional routing 926. Alternatively, the fourth set of conductive fingers 960 may be arranged in the first unidirectional routing 916. The fourth conductive pitch 962 may be the same or different from the first conductive pitch 912 and the second conductive pitch 922. For example, the fourth conductive pitch 962 may be equal to or greater than 200% of a width of the fourth set of conductive fingers 960. The fourth interconnect layer 964 may be an Mx-3 interconnect layer. According to an aspect of the present disclosure, the Mx-3 interconnect layer may be any of the M1-M3 interconnect layers. A third set of vias 970 may electrically couple the third set of conductive fingers 940 to the fourth set of conductive fingers 960. For example, the third set of vias 970 may be V1-V3 vias.

The fourth set of conductive fingers 960 may include a seventh subset of conductive fingers 960-1 and an eighth subset of conductive fingers 960-2. Capacitors C3 may be formed between the seventh subset of conductive fingers 960-1 and the eighth subset of conductive fingers 960-2.

A fifth capacitor node 972 may be formed where the fifth subset of conductive fingers 940-1 overlaps with the eighth subset of conductive fingers 960-2. A sixth capacitor node (not shown) may be formed where the sixth subset of conductive fingers 940-2 overlaps with the seventh subset of conductive fingers 960-1. For example, the fifth capacitor node 972 and the seventh capacitor node may form capacitors C4 having a fourth capacitance. As described herein, the capacitors C1-C4 may have the same or different capacitances.

The third set of vias 970 may include a fifth subset of vias 970-1 and a sixth subset of vias 970-2. The fifth subset of vias 970-1 may couple the fifth subset of conductive fingers 940-1 to the seventh subset of conductive fingers 960-1, and the sixth subset of vias 970-2 may couple the sixth subset of conductive fingers 940-2 to the eighth subset of conductive fingers 960-2.

The fifth subset of conductive fingers 940-1 and the sixth subset of conductive fingers 940-2 may be alternately arranged. The seventh subset of conductive fingers 960-1 and the eighth subset of conductive fingers 960-2 may also be alternately arranged. For example, the fifth subset of conductive fingers 940-1 may be positively biased and the sixth subset of conductive fingers 940-2 may be negatively biased, and the seventh subset of conductive fingers 960-1 may be positively biased and the eighth subset of conductive fingers 960-2 may be negatively biased.

A second set of super-vias 947 may couple the second set of conductive fingers 920 to the fourth set of conductive fingers 960. For example, the second set of super-vias 947 may couple one of the fourth subset of conductive fingers 920-2 to one of the eighth subset of conductive fingers 960-2. A capacitance C3' may be between the second set of super-vias 947 and one of the fifth subset of conductive fingers 940-1.

The fourth set of conductive fingers 960 may be coupled to a fifth set of conductive fingers 980 having a fifth conductive pitch 985 at a fifth interconnect layer 984 through a fourth set of vias 990. For example, the fourth set of vias 990 may be V2-V4 vias.

The fifth set of conductive fingers 980 may be arranged in the first unidirectional routing 916 or the second unidirectional routing 926. The fifth conductive pitch 985 may be the same or different from the third conductive pitch 942. For example, the fifth conductive pitch 985 may be equal to or greater than 200% of a width of the fifth set of conductive fingers 980. The fifth interconnect layer 984 may be an Mx-4 interconnect layer. According to an aspect of the present disclosure, the Mx-4 interconnect layer may be any of the M2-M4 interconnect layers.

The fifth set of conductive fingers 980 may include a ninth subset of conductive fingers 980-1 and a tenth subset of conductive fingers 980-2. Capacitors C3 may be formed between the ninth subset of conductive fingers 980-1 and the tenth subset of conductive fingers 980-2.

A seventh capacitor node 982 may be formed where the eighth subset of conductive fingers 960-2 and the ninth subset of conductive fingers 980-1 overlap. An eighth capacitor node (not shown) may be formed where the seventh subset of conductive fingers 960-1 and the tenth subset of conductive fingers 980-2 overlap. For example, the seventh capacitor node 982 and the eighth capacitor node may form capacitors C4.

According to an aspect of the present disclosure, the fourth set of conductive fingers 960 may be electrically coupled to the fifth set of conductive fingers 980 in a staggered configuration. For example, the fourth set of vias 990 may include a seventh subset of vias 990-1 and an eighth subset of vias 990-2. The seventh subset of vias 990-1 may couple the seventh subset of conductive fingers 960-1 to the ninth subset of conductive fingers 980-1, and the eighth subset of vias 990-2 may couple the eighth subset of conductive fingers 960-2 to the tenth set of conductive fingers 980-2.

The ninth subset of conductive fingers 980-1 and the tenth subset of conductive fingers 980-2 may also be alternately arranged. For example, the ninth subset of conductive fingers 980-1 may be positively biased and the tenth subset of conductive fingers 980-2 may be negatively biased.

The first set of super-vias 937 may couple the third set of conductive fingers 940 to the fifth set of conductive fingers 980. For example, the first set of super-vias 937 may couple one of the fifth subset of conductive fingers 940-1 to one of the ninth subset of conductive fingers 980-1. A capacitance C3' may be between the first set of super-vias 937 and one of the eighth subset of conductive fingers 960-2.

The RTMOM 900 may include a sixth set of conductive fingers 995 having a sixth conductive pitch 987 at a sixth interconnect layer 994 and arranged in the second unidirectional routing 926 or the first unidirectional routing 916. The sixth conductive pitch 987 may be the same or different from the fifth conductive pitch 985. For example, the sixth conductive pitch 687 may be equal to or greater than 200% of a width of the sixth set of conductive fingers 995. The sixth interconnect layer 994 may be an Mx-5 interconnect layer. According to an aspect of the present disclosure, the Mx-5 interconnect layer may be any of the M1-M3 interconnect layers. A fifth set of vias 993 may electrically couple the fifth set of conductive fingers 980 to the sixth set of conductive fingers 995. For example, the fifth set of vias 993 may be V1-V3 vias.

The sixth set of conductive fingers 995 may include an eleventh subset of conductive fingers 995-1 and a twelfth subset of conductive fingers 995-2. Capacitors C3 may be formed between the eleventh subset of conductive fingers 995-1 and the twelfth subset of conductive fingers 995-2.

A ninth capacitor node 992 may be formed where the ninth subset of conductive fingers 980-1 overlaps with the twelfth subset of conductive fingers 995-2. A tenth capacitor node (not shown) may be formed where the tenth subset of conductive fingers 980-2 overlaps with the eleventh subset of conductive fingers 995-1. For example, the ninth capacitor node 992 may form capacitors C4.

The fifth set of vias 993 may include a ninth subset of vias 993-1 and a tenth subset of vias 993-2. The ninth subset of vias 993-1 may couple the ninth subset of conductive fingers 980-1 to the eleventh subset of conductive fingers 995-1, and the tenth subset of vias 993-2 may couple the tenth subset of conductive fingers 980-2 to the twelfth subset of conductive fingers 995-2.

The eleventh subset of conductive fingers 995-1 and the twelfth subset of conductive fingers 995-2 may be alternately arranged. For example, the eleventh subset of conductive fingers 995-1 may be positively biased and the twelfth subset of conductive fingers 995-2 may be negatively biased.

The second set of super-vias 947 may couple the fourth set of conductive fingers 960 to the sixth set of conductive fingers 995. For example, the second set of super-vias 947 may couple one of the eighth subset of conductive fingers 960-2 to one of the twelfth subset of conductive fingers 995-2. A capacitance C3' may be between the second set of super-vias 947 and one of the ninth subset of conductive fingers 980-1.

According to further aspects of the present disclosure, additional interconnect layers may be added above or below the interconnect layers (e.g., 914-994). These additional interconnect layers may be arranged in a similar configuration as any of the individual interconnect layers (e.g., 914-994), as described.

Advantages of the RTMOMs include an orthogonal and unidirectional RTMOM capacitor without a common base terminal for each layer that reduces a device footprint and increases capacitance value. This is achieved by offsetting a first set of conductive fingers from a third set of conductive fingers such that the first set of conductive fingers has a different pitch than the third set of conductive fingers. For example, the RTMOM capacitor structure utilizes different minimal metal pitch back-end-of-line (BEOL) layers by staggering the connections between the vias to couple a same capacitor terminal node. This configuration eliminates having a common base terminal for each layer and reduces the device footprint while increasing capacitance. The described RTMOMs are compatible with advanced CMOS logic and advanced processes, without any additional masks. As described, an additional mask for each layer may be used to include super-vias.

Figure 10:
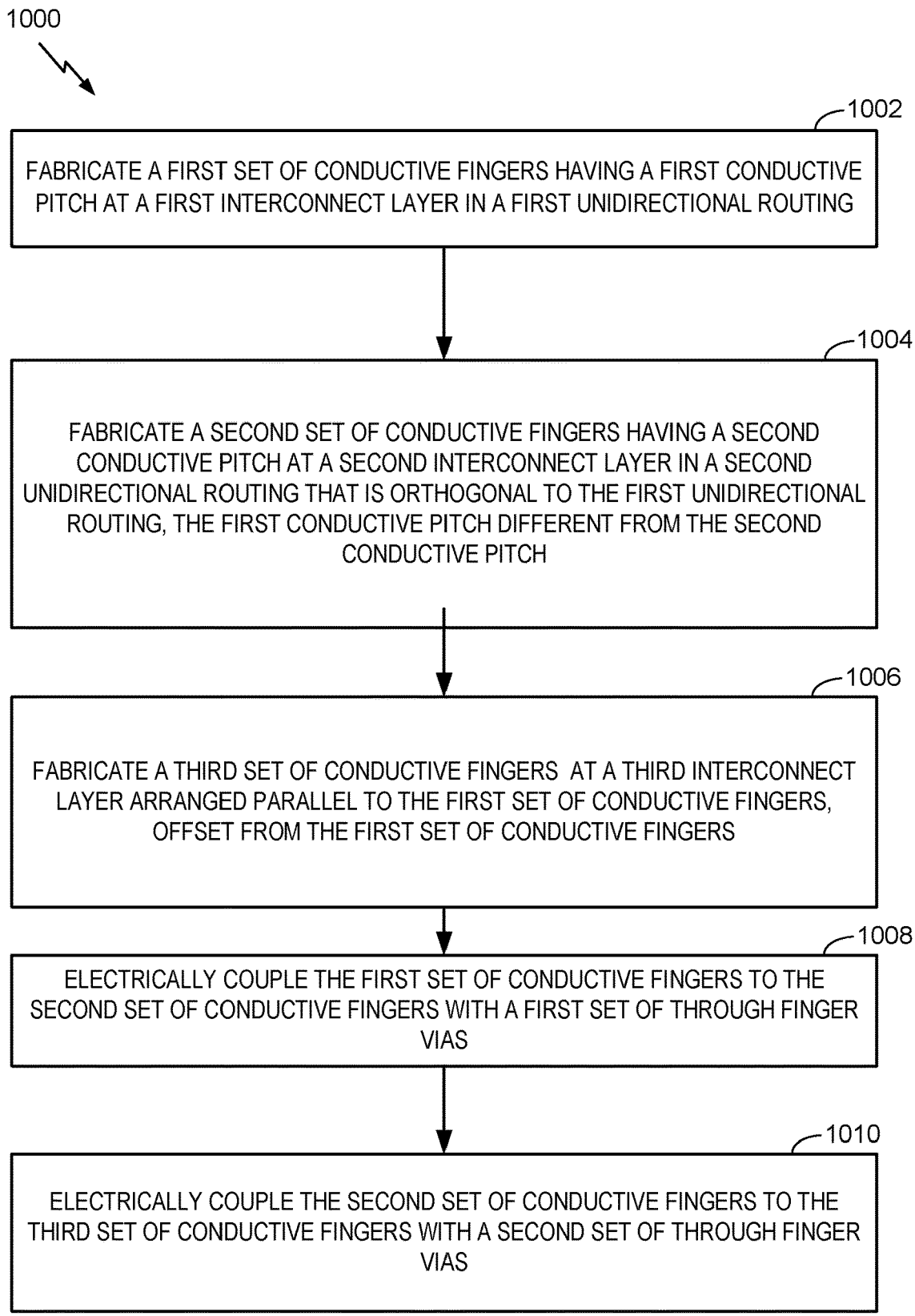
FIG. 10 is a process flow diagram illustrating a method for fabricating a rotated metal-oxide-metal (RTMOM) capacitor structure according to aspects of the present disclosure.

FIG. 10 is a process flow diagram illustrating a method of fabricating a capacitor 1000, according to aspects of the present disclosure. At block 1002, a first set of conductive fingers having a first conductive pitch at a first interconnect layer in a first unidirectional routing is fabricated. For example, an RTMOM 400 may include a first set of conductive fingers 410 having a first conductive pitch 412 at a first interconnect layer 414 and arranged in a first unidirectional routing 416, as shown in FIG. 4.

At block 1004, a second set of conductive fingers having a second conductive pitch at a second interconnect layer in a second unidirectional routing that is orthogonal to the first unidirectional routing is fabricated. The first conductive pitch may be different from the second conductive pitch. For example, the RTMOM 400 may include a second set of conductive fingers 420 having a second conductive pitch 422 at a second interconnect layer 424 and arranged in a second unidirectional routing 426, as shown in FIG. 4.

At block 1006, a third set of conductive fingers are fabricated at a third conductive layer. The third set of conductive fingers are arranged parallel to the first set of conductive fingers, but offset from the first set of conductive fingers. At block 1010 a second set of through finger vias electrically couples the third set of conductive fingers to the second set of conductive finger vias.

At block 1008, the first set of conductive fingers of the first interconnect layer is electrically coupled to the second set of conductive fingers of the second interconnect layer with a first set of through finger vias. For example, a first set of vias 430 (e.g., a set of through finger vias) may electrically couple the first set of conductive fingers 410 of the first interconnect layer 414 to the second set of conductive fingers 420 of the second interconnect layer 424.

At block 1010, the third set of conductive fingers is electrically coupled to the second set of conductive fingers with a second set of through finger vias. For example, a second set of vias 450 may electrically couple the second set of conductive fingers 420 to the third set of conductive fingers 440.

According to a further aspect of the present disclosure, a finger metal-oxide-metal (FMOM) capacitor structure is described. The capacitor structure includes means for electrically coupling. The electrically coupling means may be the first set of vias 430, 730 as shown in FIGS. 4 and 7. In another aspect, the aforementioned means may be any structure or any material configured to perform the functions recited by the aforementioned means.

Figure 11:
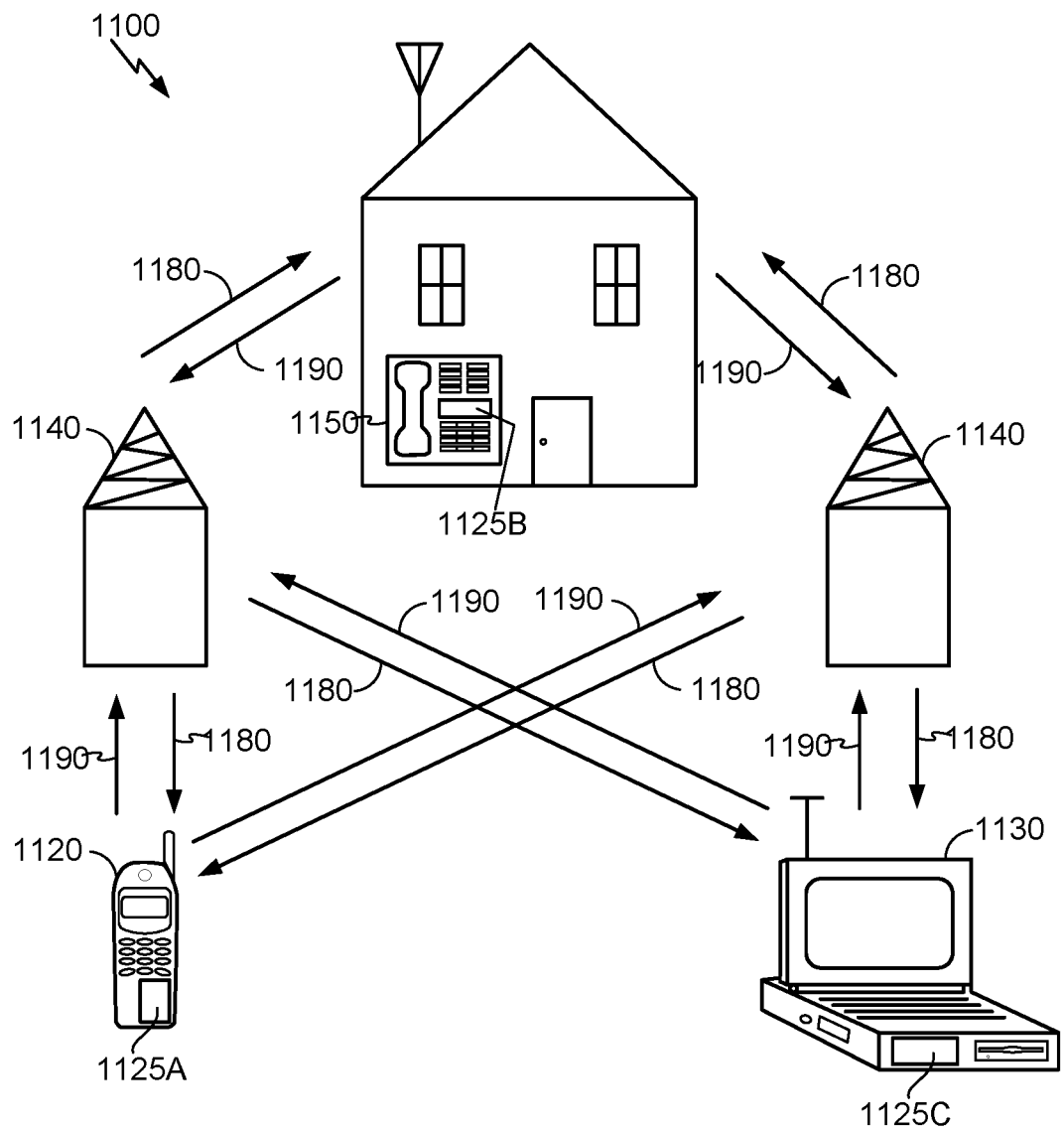
FIG. 11 is a block diagram showing an exemplary wireless communications system in which a configuration of the present disclosure may be advantageously employed.

FIG. 11 is a block diagram showing an exemplary wireless communications system 1100 in which an aspect of the present disclosure may be advantageously employed. For purposes of illustration, FIG. 11 shows three remote units 1120, 1130, and 1150 and two base stations 1140. It will be recognized that wireless communications systems may have many more remote units and base stations. Remote units 1120, 1130, and 1150 include IC devices 1125A, 1125C, and 1125B that include the disclosed capacitor. It will be recognized that other devices may also include the disclosed capacitor, such as the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base stations 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as meter reading equipment, or other devices that store or retrieve data or computer instructions, or combinations thereof. Although FIG. 11 illustrates remote units according to the aspects of the present disclosure, the present disclosure is not limited to these exemplary illustrated units. Aspects of the present disclosure may be suitably employed in many devices, which include the disclosed capacitor.

Figure 12:
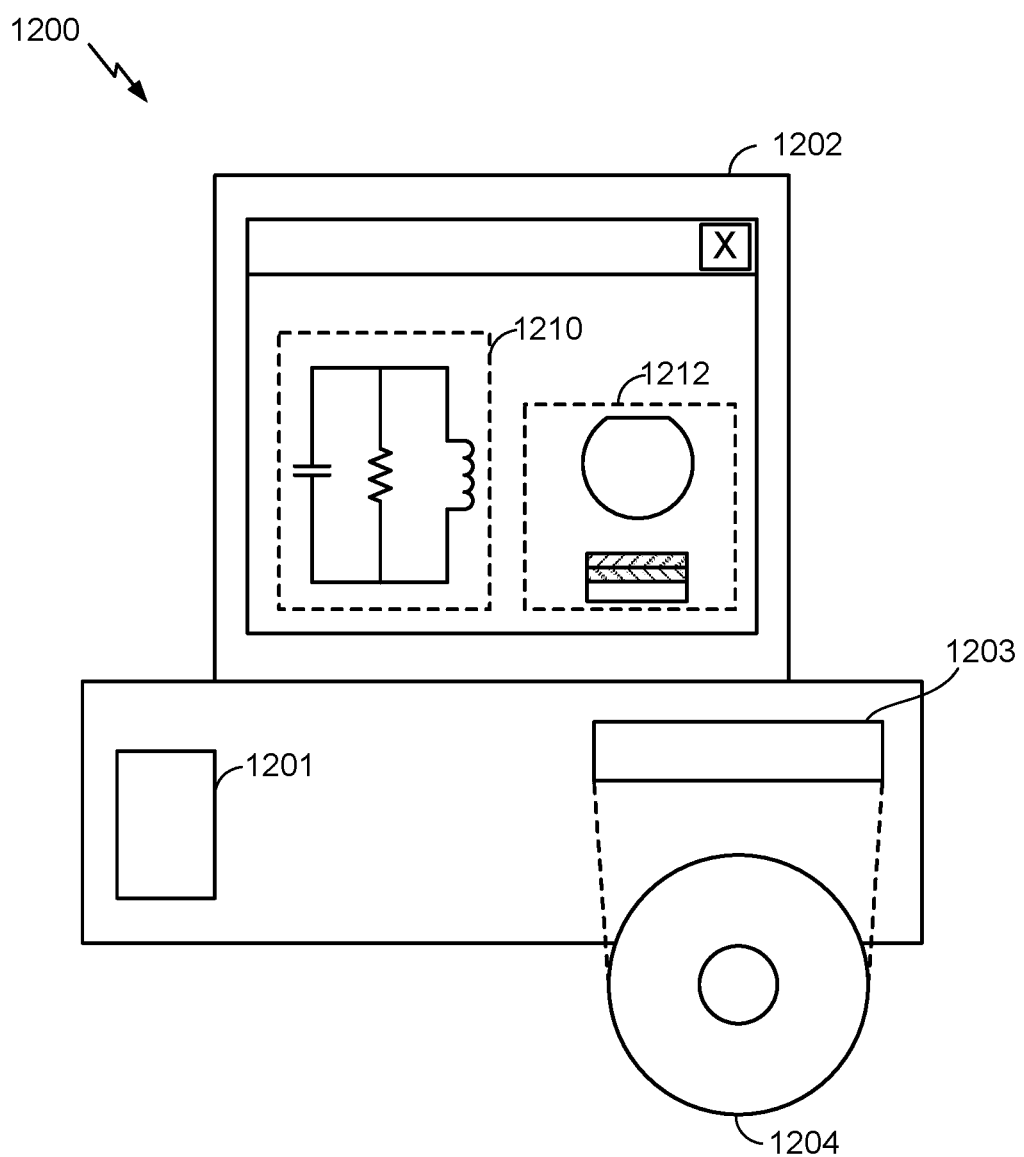
FIG. 12 is a block diagram illustrating a design workstation used for circuit, layout, and logic design of a finger metal-oxide-metal (FMOM) capacitor structure according to one configuration.

FIG. 12 is a block diagram illustrating a design workstation used for circuit, layout, and logic design of a semiconductor component, such as the capacitor disclosed above. A design workstation 1200 includes a hard disk 1201 containing operating system software, support files, and design software such as Cadence or OrCAD. The design workstation 1200 also includes a display 1202 to facilitate design of a circuit 1210 or a semiconductor component 1212 such as a capacitor. A storage medium 1204 is provided for tangibly storing the design of the circuit 1210 or the semiconductor component 1212. The design of the circuit 1210 or the semiconductor component 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit 1210 or the semiconductor component 1212 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this present disclosure that are known or later come to be known to those of ordinary skill in the art are expressly incorporated herein by reference and are intended to be encompassed by the claims. Moreover, nothing disclosed herein is intended to be dedicated to the public regardless of whether such present disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A capacitor, comprising:
   a first set of conductive fingers having a first conductive pitch at a first interconnect layer and arranged in a first unidirectional routing;
   a second set of conductive fingers having a second conductive pitch at a second interconnect layer and arranged in a second unidirectional routing that is orthogonal to the first unidirectional routing, the first conductive pitch different from the second conductive pitch;
   a first set of through finger vias electrically coupling the first set of conductive fingers of the first interconnect layer to the second set of conductive fingers of the second interconnect layer;
   a third set of conductive fingers at a third conductive layer, the third set of conductive fingers parallel to the first set of conductive fingers, but offset from the first set of conductive fingers; and
   a second set of through finger vias electrically couples the third set of conductive fingers to the second set of conductive fingers.

2. The capacitor of claim 1, in which the first set of conductive fingers is electrically coupled to the second set of conductive fingers in a staggered configuration.

3. The capacitor of claim 1, further comprising a set of super-vias electrically coupling the first set of conductive fingers to the third set of conductive fingers.

4. The capacitor of claim 3, in which the second set of conductive fingers comprises shortened conductive fingers.

5. The capacitor of claim 1, comprising a metal-oxide-metal (MOM) capacitor or a metal-insulator-metal (MIM) capacitor.

6. The capacitor of claim 1, in which the first set of conductive fingers comprise positive nodes and negative nodes, the second set of conductive fingers comprise positive nodes and negative nodes, and the third set of conductive fingers comprise positive nodes and negative nodes.

7. The capacitor of claim 1, integrated into at least one of a music player, a video player, an entertainment unit, a navigation device, a communications device, a personal digital assistant (PDA), a fixed location data unit, a mobile phone, and a portable computer.

8. A method of fabricating a capacitor, comprising:
   fabricating a first set of conductive fingers having a first conductive pitch at a first interconnect layer in a first unidirectional routing;
   fabricating a second set of conductive fingers having a second conductive pitch at a second interconnect layer in a second unidirectional routing that is orthogonal to the first unidirectional routing, the first conductive pitch different from the second conductive pitch;
   fabricating a third set of conductive fingers at a third interconnect level, the third set of conductive fingers arranged parallel to the first set of conductive fingers but offset from the first set of conductive fingers;
   electrically coupling the first set of conductive fingers of the first interconnect layer to the second set of conductive fingers of the second interconnect layer with a first set of finger vias; and
   electrically coupling the third set of conductive fingers to the second set of conductive fingers with a second set of finger vias.

9. The method of claim 8, further comprising electrically coupling the first set of conductive fingers to the second set of conductive fingers in a staggered configuration.

10. The method of claim 8, further comprising electrically coupling a set of super-vias between the first set of conductive fingers and the third set of conductive fingers.

11. The method of claim 10, in which the second set of conductive fingers comprises shortened conductive fingers.

12. The method of claim 8, further comprising coupling positive nodes of the first set of conductive fingers to positive nodes of the second set of conductive fingers and positive nodes of the third set of conductive fingers.

13. The method of claim 8, further comprising integrating the capacitor into at least one of a music player, a video player, an entertainment unit, a navigation device, a communications device, a personal digital assistant (PDA), a fixed location data unit, a mobile phone, and a portable computer.

14. A capacitor, comprising:
a first set of conductive fingers having a first conductive pitch at a first interconnect layer and arranged in a first unidirectional routing;
a second set of conductive fingers having a second conductive pitch at a second interconnect layer and arranged in a second unidirectional routing that is orthogonal to the first unidirectional routing, the first conductive pitch different from the second conductive pitch;
a third set of conductive fingers at a third conductive layer, the third set of conductive fingers parallel to the first set of conductive fingers, but offset from the first set of conductive fingers;
means for electrically coupling the first set of conductive fingers of the first interconnect layer to the second set of conductive fingers of the second interconnect layer; and
means for electrically coupling the third set of conductive fingers to the second set of conductive fingers.

15. The capacitor of claim 14, in which the first set of conductive fingers is electrically coupled to the second set of conductive fingers in a staggered configuration.

16. The capacitor of claim 14, further comprising a set of super-vias electrically coupling the first set of conductive fingers to the third set of conductive fingers.

17. The capacitor of claim 16, in which the second set of conductive fingers comprises shortened conductive fingers.

18. The capacitor of claim 14, comprising a metal-oxide-metal (MOM) capacitor or a metal-insulator-metal (MIM) capacitor.

19. The capacitor of claim 14, in which the first set of conductive fingers comprise positive nodes and negative nodes, the second set of conductive fingers comprise positive nodes and negative nodes, and the third set of conductive fingers comprise positive nodes and negative nodes.

20. The capacitor of claim 14, integrated into at least one of a music player, a video player, an entertainment unit, a navigation device, a communications device, a personal digital assistant (PDA), a fixed location data unit, a mobile phone, and a portable computer.

* * * * *